(12) United States Patent
Oh et al.

(10) Patent No.: US 10,896,918 B1
(45) Date of Patent: Jan. 19, 2021

(54) SEMICONDUCTOR MEMORY DEVICE AND MANUFACTURING METHOD THEREOF

(71) Applicant: SK hynix Inc., Icheon-si (KR)

(72) Inventors: Sung Lae Oh, Cheongju-si (KR); Dong Hyuk Kim, Seoul (KR); Tae Sung Park, Icheon-si (KR); Soo Nam Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/723,460

(22) Filed: Dec. 20, 2019

(30) Foreign Application Priority Data

Jul. 15, 2019 (KR) .................... 10-2019-0085409

(51) Int. Cl.
*H01L 27/11582* (2017.01)
*H01L 23/528* (2006.01)
(Continued)

(52) U.S. Cl.
CPC .... *H01L 27/11582* (2013.01); *H01L 21/31111* (2013.01); *H01L 21/76802* (2013.01); *H01L 21/76877* (2013.01); *H01L 23/528* (2013.01); *H01L 23/5226* (2013.01); *H01L 24/05* (2013.01); *H01L 24/08* (2013.01); *H01L 25/18* (2013.01); *H01L 25/50* (2013.01); *H01L 27/11526* (2013.01); *H01L 27/11556* (2013.01); *H01L 27/11573* (2013.01); *H01L 2224/0557* (2013.01); *H01L 2224/08147* (2013.01);
(Continued)

(58) Field of Classification Search
CPC ......... H01L 27/11582; H01L 27/11556; H01L 24/05; H01L 21/31111; H01L 21/76877; H01L 24/08; H01L 27/11573; H01L 27/11526; H01L 23/5226; H01L 25/18; H01L 23/528; H01L 25/50; H01L 21/76802; H01L 2224/0557; H01L 2224/08147; H01L 2924/1431; H01L 2924/14511
See application file for complete search history.

(56) References Cited

U.S. PATENT DOCUMENTS 10,797,062 B1 * 10/2020 Nishikawa ........ H01L 27/11582
2019/0067314 A1 * 2/2019 Lu .................... H01L 27/11556
(Continued)

FOREIGN PATENT DOCUMENTS

KR 10-2017-0125551 A 11/2017
KR 10-2020-0103484 A 9/2020

*Primary Examiner* — Victor A Mandala

(57) ABSTRACT

A semiconductor memory device includes a stack disposed over a substrate defined with cell and connection areas; channel structures passing through the stack in the cell area; and slits defined in the stack. The stack includes first dielectric layers separately staked in the cell and connection areas; electrode layers disposed alternately with the first dielectric layers in the cell area and a periphery of the connection area adjacent to the slits; and second dielectric layers disposed alternately with the first dielectric layers in a central part of the connection area distant from the slits. A distance between the slits in the connection area is larger than a distance between the slits in the cell area, and, at a boundary between the periphery and the central part of the connection area, the electrode layers and the second dielectric layers disposed at the same layers are in contact with each other.

17 Claims, 44 Drawing Sheets

(51) Int. Cl.
  *H01L 23/522*      (2006.01)
  *H01L 27/11526*    (2017.01)
  *H01L 25/00*       (2006.01)
  *H01L 25/18*       (2006.01)
  *H01L 23/00*       (2006.01)
  *H01L 27/11573*    (2017.01)
  *H01L 27/11556*    (2017.01)
  *H01L 21/768*      (2006.01)
  *H01L 21/311*      (2006.01)

(52) U.S. Cl.
  CPC .................. *H01L 2924/1431* (2013.01); *H01L 2924/14511* (2013.01)

(56) References Cited

U.S. PATENT DOCUMENTS

| | | | |
|---|---|---|---|
| 2019/0371811 A1* | 12/2019 | Oike | H01L 27/1156 |
| 2020/0185405 A1* | 6/2020 | Cui | H01L 29/40117 |
| 2020/0266146 A1* | 8/2020 | Nishida | H01L 23/5226 |
| 2020/0303398 A1* | 9/2020 | Otsu | H01L 27/11529 |
| 2020/0312765 A1* | 10/2020 | Kawasaki | H01L 27/11524 |
| 2020/0343235 A1* | 10/2020 | Zhang | H01L 25/50 |

* cited by examiner

FIG.4
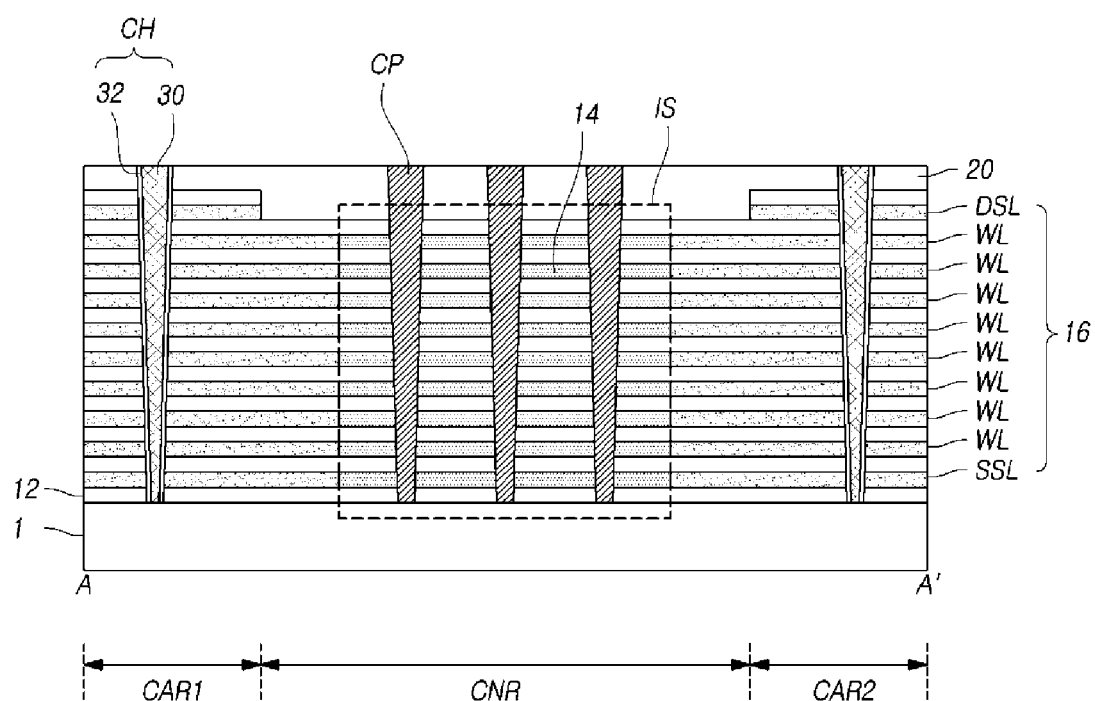

FIG. 7A
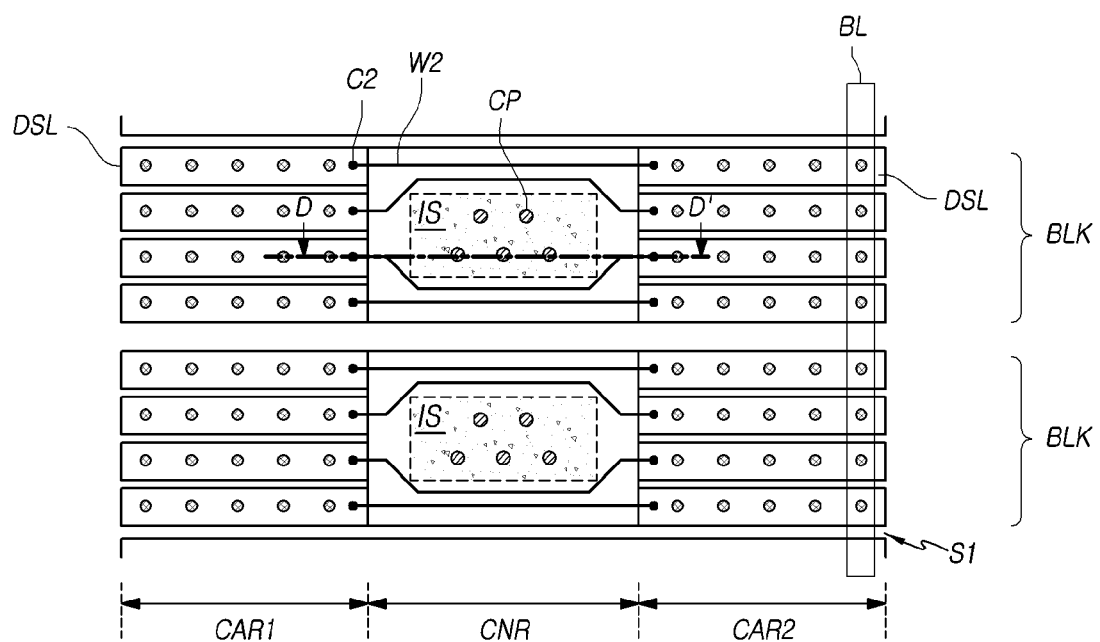

FIG. 7B
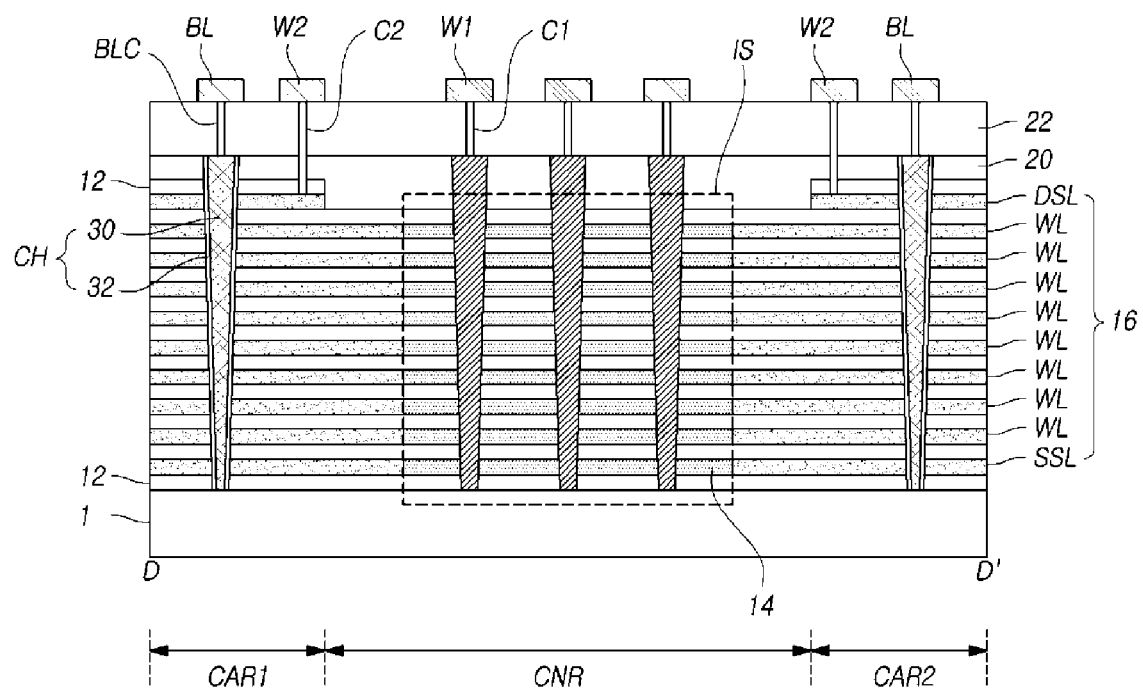

FIG.17A
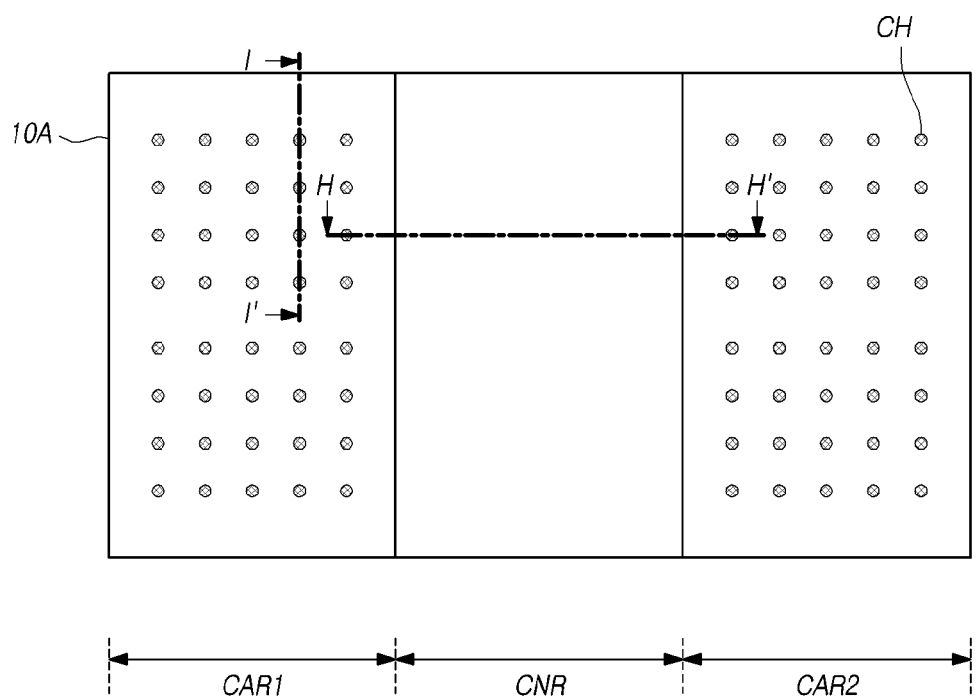

FIG.18C
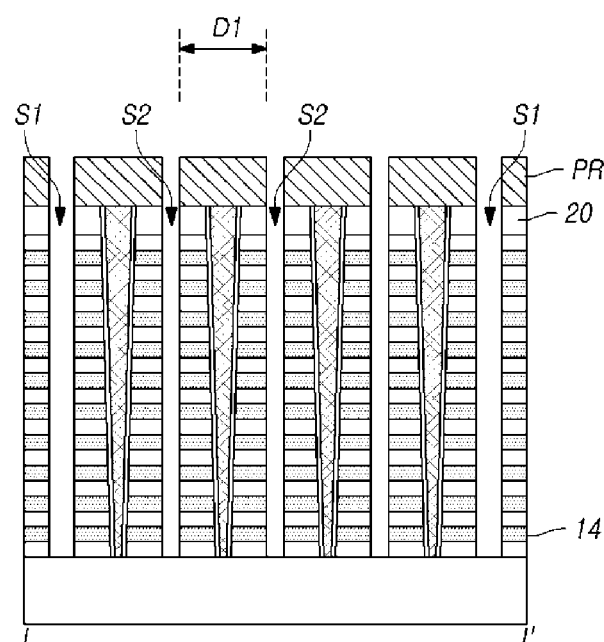
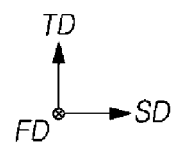

FIG.19A
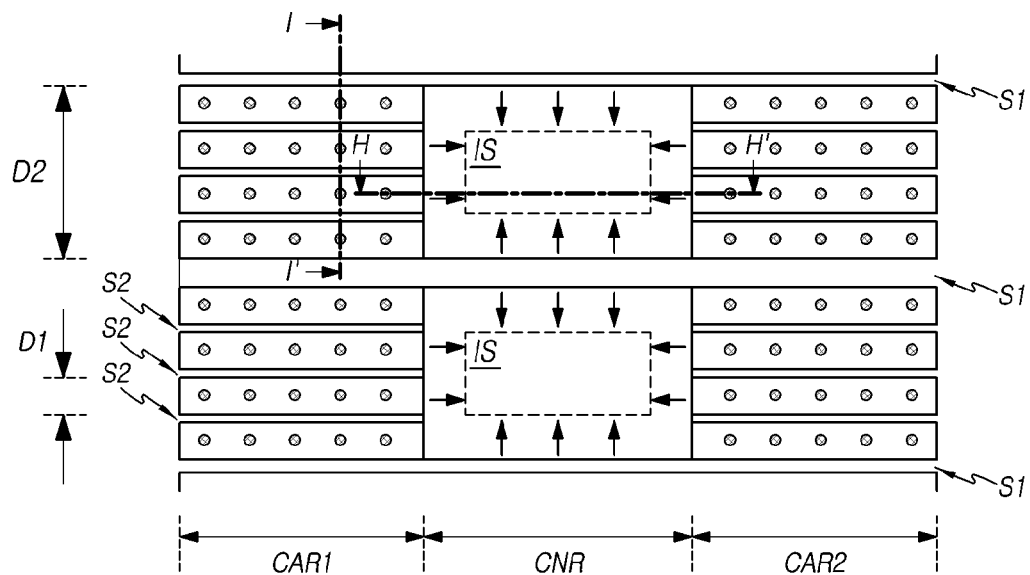

FIG.20B
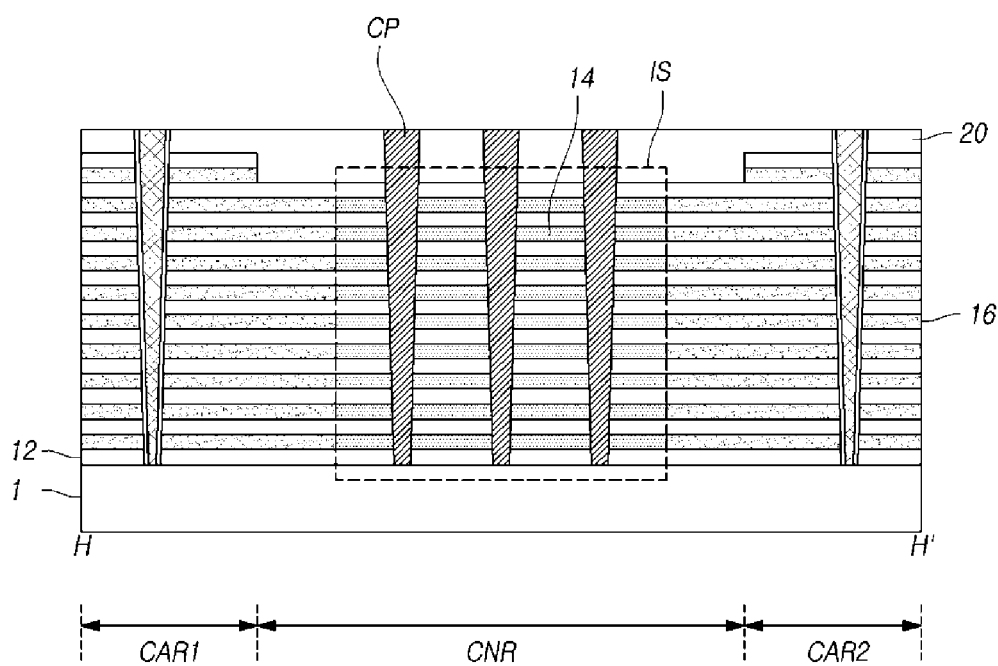

FIG.21A
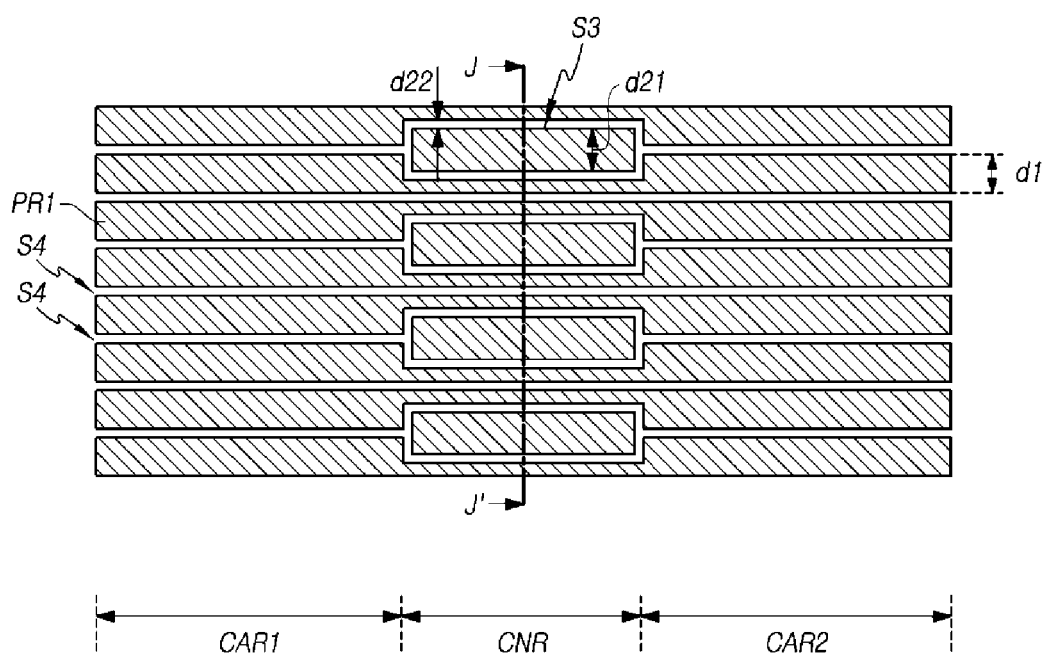

FIG.23A
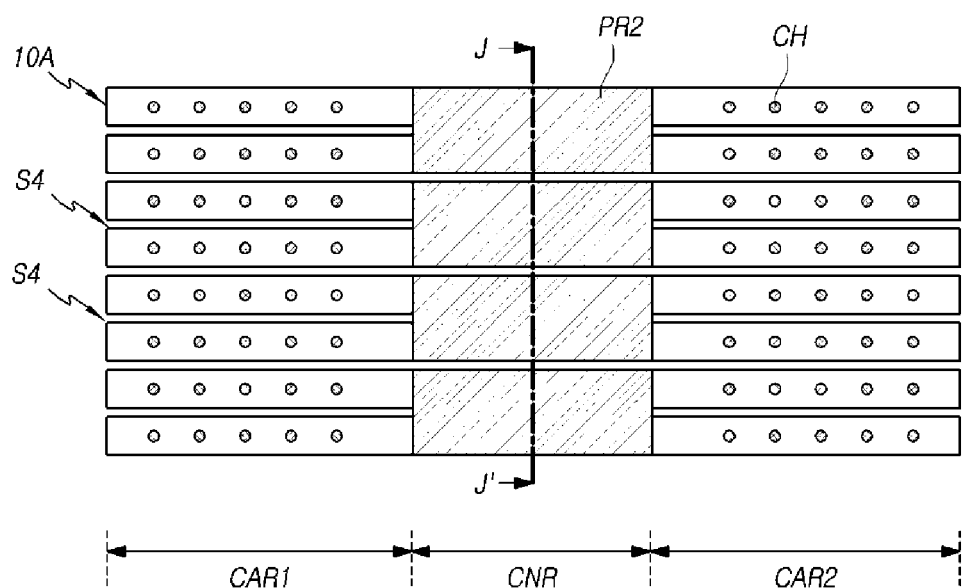

FIG.24B
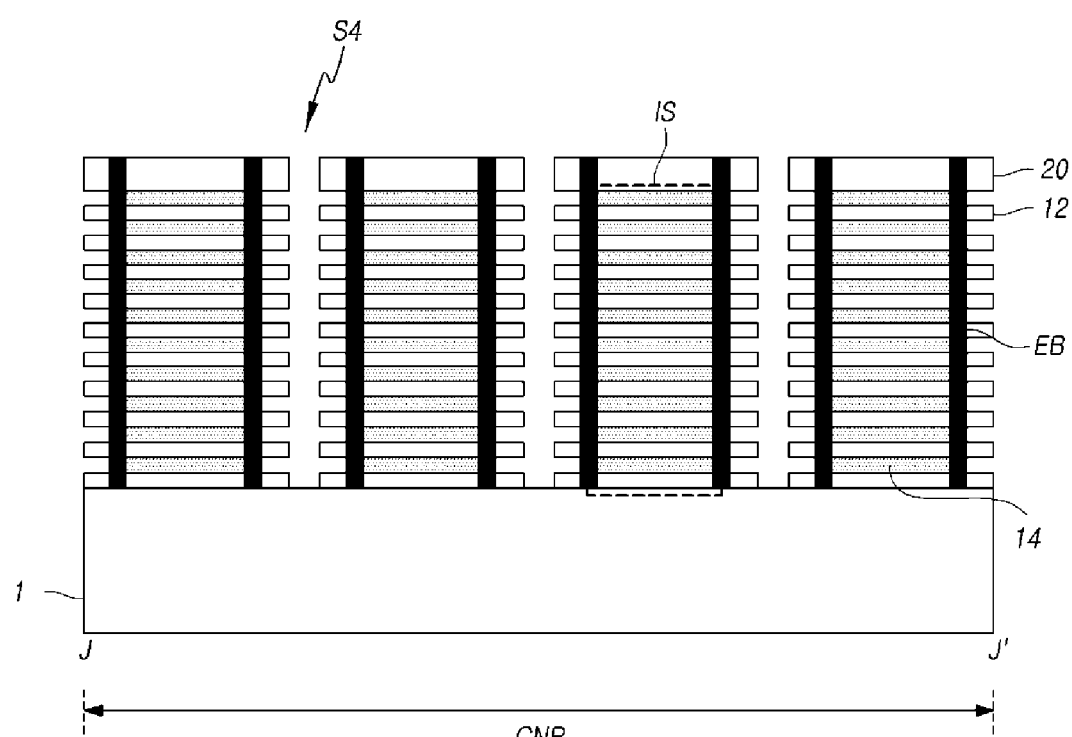
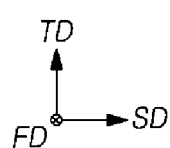

FIG.25A
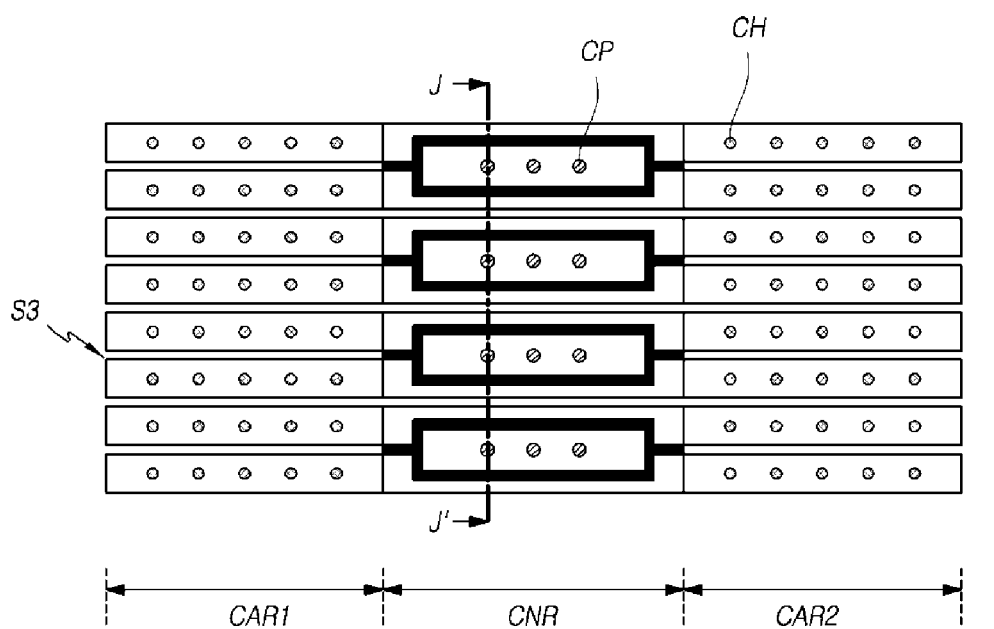

SEMICONDUCTOR MEMORY DEVICE AND MANUFACTURING METHOD THEREOF

CROSS-REFERENCE TO RELATED APPLICATION

The present application claims priority under 35 U.S.C § 119(a) to Korean Patent Application No. 10-2019-0085409 filed in the Korean Intellectual Property Office on Jul. 15, 2019, which is incorporated herein by reference in its entirety.

BACKGROUND

1. Technical Field

Various embodiments generally relate to a semiconductor memory device, and more particularly, to a semiconductor memory device having a 3-dimensional structure and a manufacturing method thereof.

2. Related Art

In order to meet the excellent performance and low prices that consumers demand, increases in the degree of integration of semiconductor devices are necessary. In the case of a two-dimensional (2D) or planar semiconductor memory device, because the degree of integration thereof is mainly determined by the area occupied by a unit memory cell, the degree of integration is greatly influenced by the complexity of a fine pattern forming technique. However, highly expensive equipment is required for the formation of a fine pattern, so the degree of integration of a 2D semiconductor memory device is still limited, although it is being increased. As an alternative to overcome such a limitation, a semiconductor memory device having a three-dimensional structure including three-dimensionally arranged memory cells has been proposed.

SUMMARY

In an embodiment, a semiconductor memory device may include: a stack with a cell area and a connection area disposed over a substrate; a plurality of channel structures passing through the stack in the cell area; and a plurality of slits. The stack may include: a plurality of first dielectric layers; a plurality of electrode layers alternately stacked with the plurality of first dielectric layers in the cell area and a periphery of the connection area; and a plurality of second dielectric layers alternately stacked with the plurality of first dielectric layers in a center of the connection area. A distance between the slits in the connection area may be larger than a distance between the slits in the cell area. At an intersection of between the periphery and the center of the connection area, one of the plurality of electrode layers and one of the plurality of second dielectric layers may be in contact with each other.

In an embodiment, a semiconductor memory device may include: a memory structure disposed over a first substrate; and a logic structure disposed over a second substrate. The memory structure may include: a stack with a cell area and a connection area disposed over the first substrate; a plurality of channel structures passing through the stack in the cell area; and a plurality of slits. The stack may include: a plurality of first dielectric layers; a plurality of electrode layers alternately stacked with the plurality of first dielectric layers in the cell area and a periphery of the connection area; and a plurality of second dielectric layers alternately stacked with the plurality of first dielectric layers in a center of the connection area. A distance between the slits in the connection area may be larger than a distance between the slits in the cell area. At an intersection between the periphery and the center of the connection area, one of the plurality of electrode layers and one of the plurality of second dielectric layers may be in contact with each other.

In an embodiment, a method for manufacturing a semiconductor memory device may include: forming a pre-stack by alternately stacking a plurality of first dielectric layers and a plurality of second dielectric layers over a substrate which has a cell area and a connection area; forming a plurality of slits which pass through the pre-stack, such that a distance between the slits in the connection area is larger than a distance between the slits in the cell area; removing the second dielectric layers in the cell area and in a periphery of the connection area adjacent to the slits while leaving the second dielectric layer in a center of the connection area by injecting an etching solution for removing the second dielectric layers, through the slits; and forming electrode layers in spaces from which the second dielectric layers are removed.

BRIEF DESCRIPTION OF THE DRAWINGS

FIG. 4 is a cross-sectional view taken along the line A-A' of FIG. 3 in accordance with an embodiment of the disclosure.

FIG. 7A is a top view illustrating an example of a semiconductor memory device in accordance with an embodiment of the disclosure.

FIG. 7B is a cross-sectional view taken along the line D-D' of FIG. 7A in accordance with an embodiment of the disclosure.

FIGS. 17A to 20A are examples of top views to assist in the explanation of a method for manufacturing a semiconductor memory device in accordance with an embodiment of the disclosure.

FIGS. 17B to 20B are cross-sectional views taken along the lines H-H' of FIGS. 17A to 20A in accordance with an embodiment of the disclosure.

FIGS. 17C to 20C are cross-sectional views taken along the lines I-I' of FIGS. 17A to 20A in accordance with an embodiment of the disclosure.

FIGS. 21A to 25A are examples of top views to assist in the explanation of a method for manufacturing a semiconductor memory device in relation with the disclosure.

FIGS. 21B to 25B are cross-sectional views taken along the lines J-J' of FIGS. 21A to 25A in accordance with an embodiment of the disclosure.

DETAILED DESCRIPTION

Figure 1:
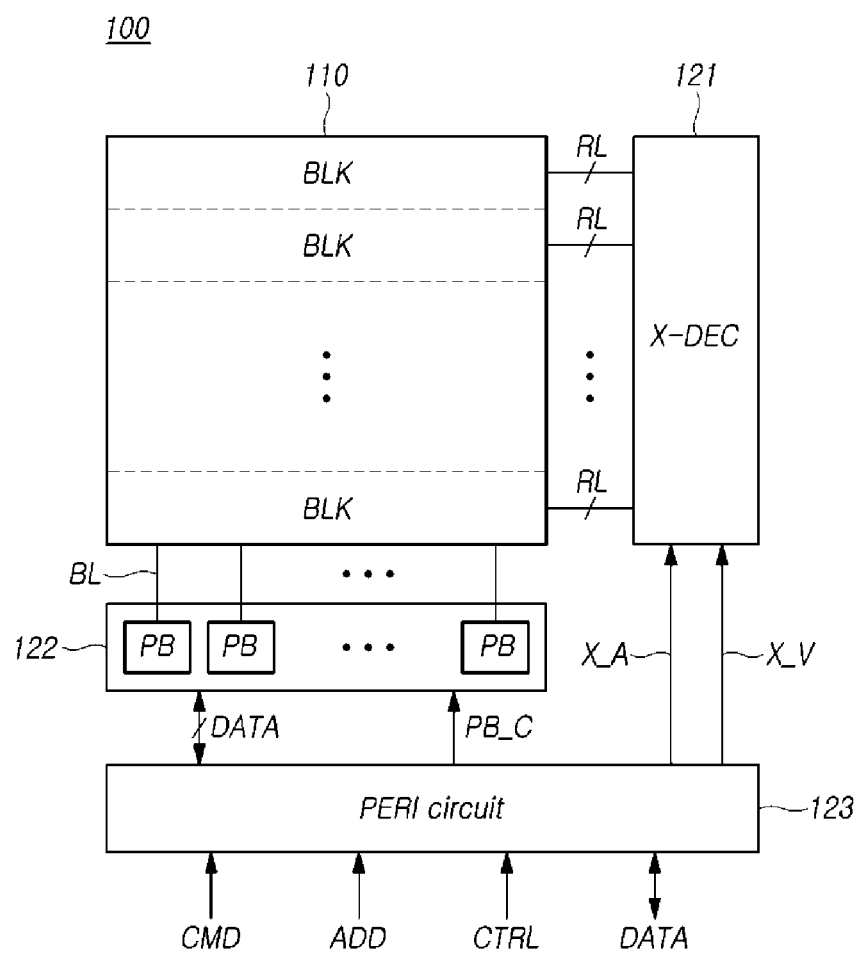
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or the clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun, (e.g. "a," "an," "the") the article may include a plural of that noun unless specifically stated otherwise.

Embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other, and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device and a manufacturing method thereof will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example of the semiconductor memory device 100, it is to be understood that the technical spirit of the present disclosure is not limited thereto.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one, among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK selected among the memory blocks BLK included in the memory cell array 110.

The page buffer circuit 122 may include a plurality of page buffers PB which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit is line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write or read data in or from a memory cell which is coupled to a word line activated by the row decoder 121.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, that are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a third direction TD. For example, the first direction FD may correspond to the extending direction of word lines, and the second direction SD may correspond to the extending direction of bit lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' will be used as substantially the same meaning as the third direction TD. In the drawings, a direction indicated by an arrow and a direction opposite thereto represent the same direction.

Figure 2:
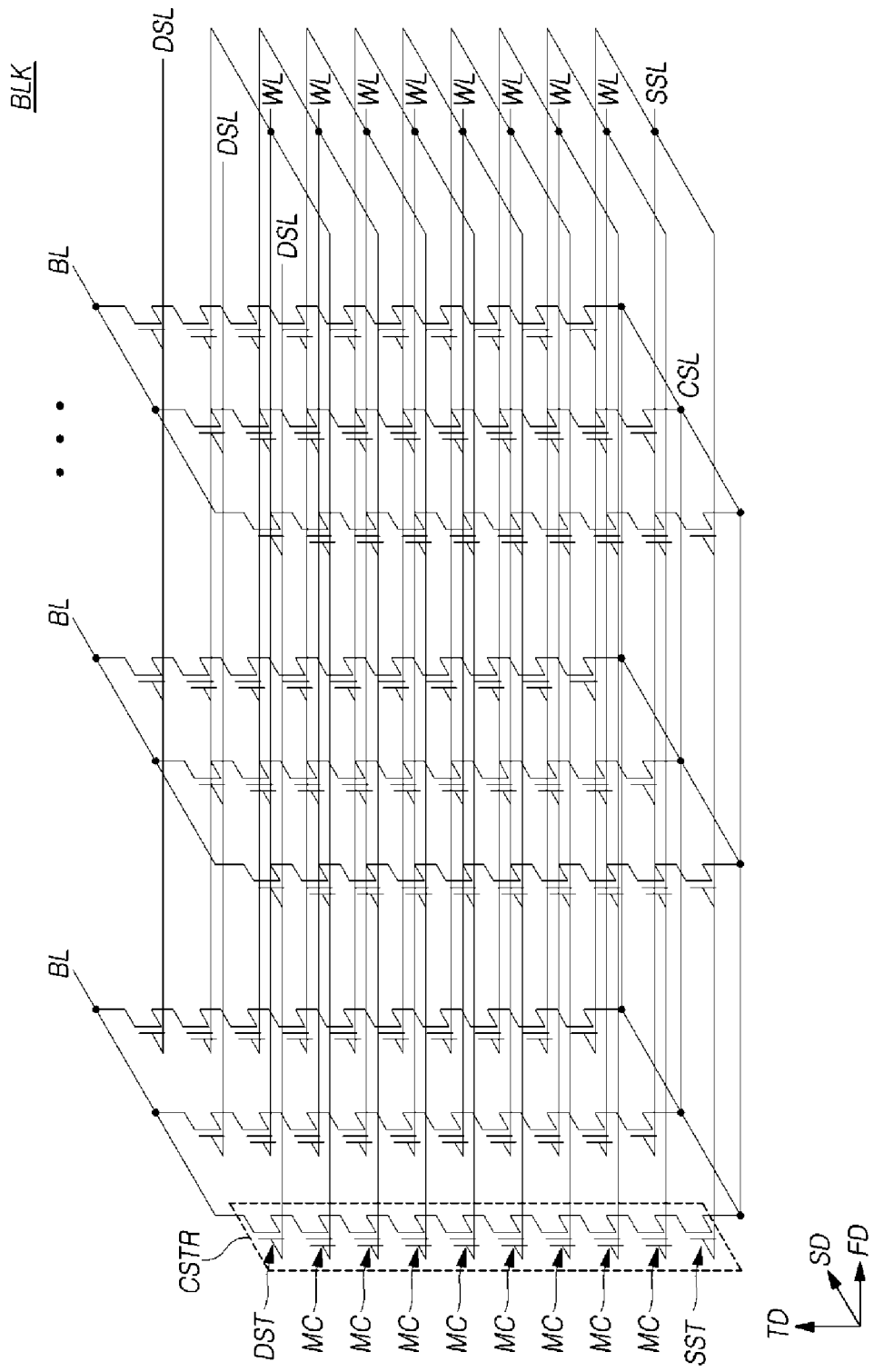
FIG. 2 is an equivalent circuit diagram illustrating an example of a memory block illustrated in FIG. 1 in accordance with an embodiment of the disclosure.

FIG. 2 is an equivalent circuit diagram illustrating an example of one of the memory blocks BLK illustrated in FIG. 1 in accordance with an embodiment of the disclosure.

Referring to FIG. 2, the memory block BLK may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be disposed in the third direction TD between the bit lines BL and the common source line CSL. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page.

Figure 3:
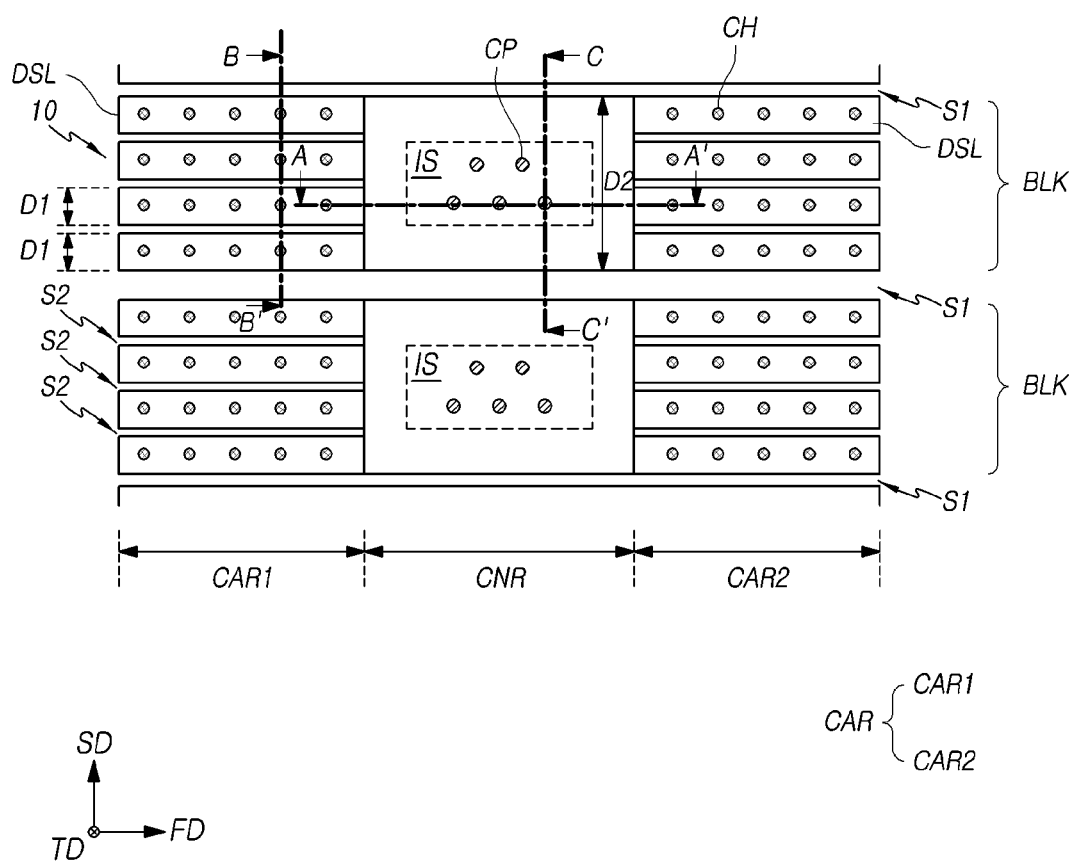
FIG. 3 is a top view illustrating an example of a portion of a semiconductor memory device in accordance with an embodiment of the disclosure.
Figure 5:
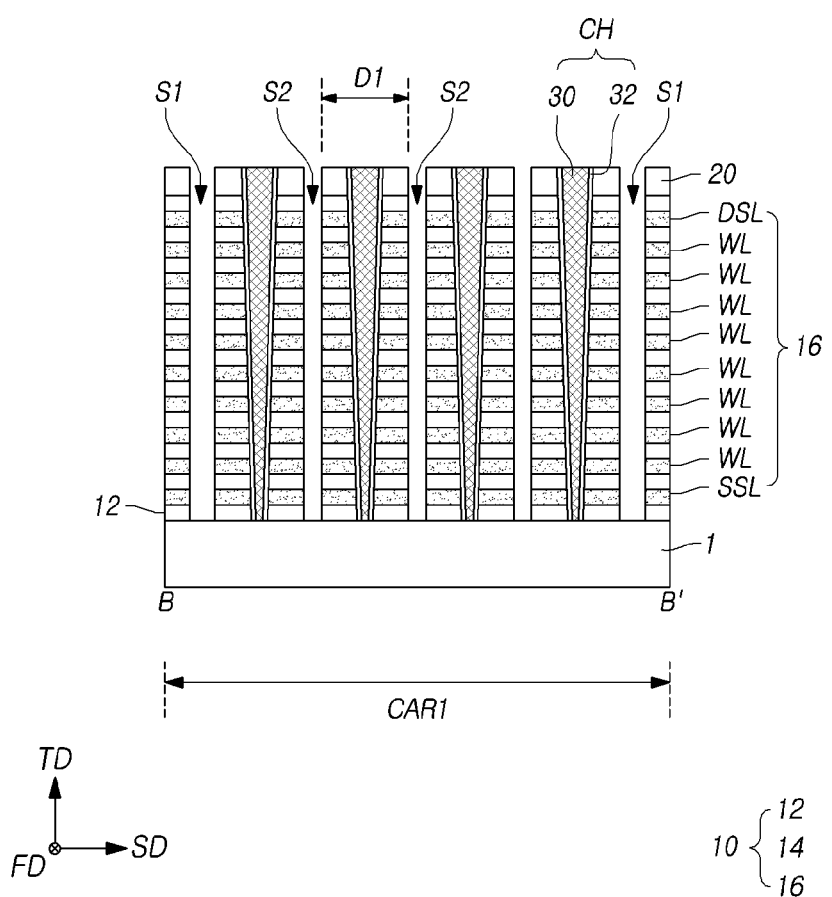
FIG. 5 is a cross-sectional view taken along the line B-B' of FIG. 3 in accordance with an embodiment of the disclosure.
Figure 6:
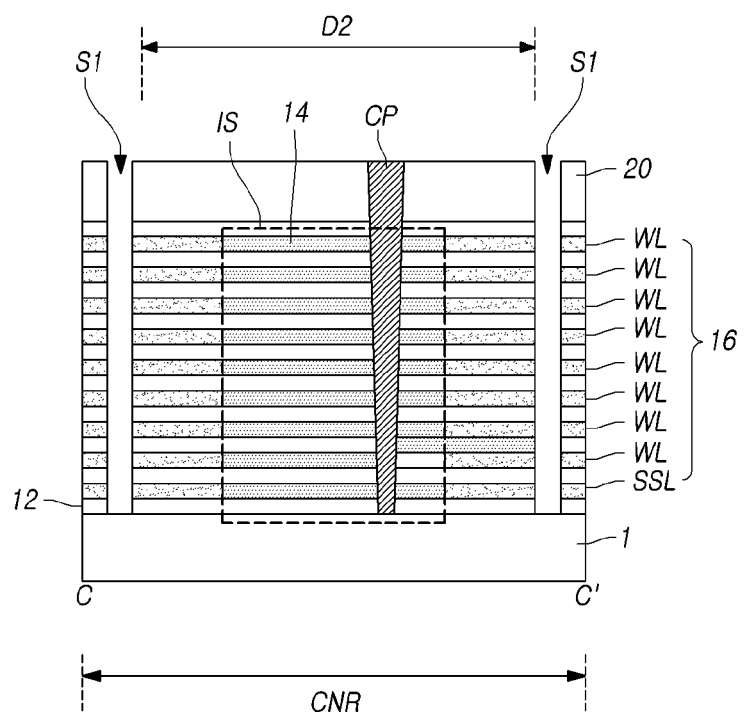
FIG. 6 is a cross-sectional view taken along the line C-C' of FIG. 3 in accordance with an embodiment of the disclosure.

FIG. 3 is a top view illustrating an example of a portion of a semiconductor memory device in accordance with an embodiment of the disclosure. FIG. 4 is a cross-sectional view taken along the line A-A' of FIG. 3. FIG. 5 is a cross-sectional view taken along the line B-B' of FIG. 3. FIG. 6 is a cross-sectional view taken along the line C-C' of FIG. 3.

Referring to FIG. 3, a semiconductor memory device may include a cell area CAR and a connection area CNR. The cell area CAR may include a first cell area CAR1 and a second cell area CAR2, which are disposed and spaced apart in the first direction FD. The connection area CNR may be disposed between the first cell area CAR1 and the second cell area CAR2. Memory blocks BLK are spaced apart in the second direction SD, and each memory block BLK may span across a first cell area CAR1, a second cell area CAR2, and a connection area CNR.

A memory block may include a stack 10 disposed on or over a substrate (not illustrated) that spans the first and second cell areas CAR1 and CAR2 and the connection area CNR. A plurality of channel structures CH, which pass through or penetrate the stack 10 in a vertical direction (i.e., in the third direction), may be defined or disposed in the stack 10 in the first and second cell areas CAR1 and CAR2. The channel structures CH may be arranged and spaced apart from each other in the first direction FD and/or the second direction SD. As an example, channel structures CH may be spaced apart in rows (in the first direction) and columns (in the second direction) as illustrated in FIG. 3.

Stacks 10 of memory blocks BLK are separated by first slits S1. First slits S1 are gaps or spaces that are substantially parallel to a plane defined by the first direction and the third direction. First slits S1 extend in the first direction FD and the third direction in the stack 10 through the first and second cell areas CAR1 and CAR2 and the connection area CNR. Memory blocks BLK may extend in the first direction FD, similar to the extending direction of the first slits S1, and may be arranged in the second direction SD. Although the present embodiment illustrates that the first slits S1 divide the stack 10, and the channel structures CH therein, in a memory block BLK, it is to be noted that the first slits S1 may divide the stack 10 and the channel structures CH in a unit smaller than memory block BLK.

Within first cell area CAR1 and second cell area CAR2 of a memory block BLK, stack 10 may be divided into one or more sections by second slits S2. Second slits S2 may be substantially parallel to first slits S1 and may extend in the first direction FD through the stack 10 from an outer edge of the memory block BLK to the connection area CNR. In the first and second cell areas CAR1 and CAR2, at least one second slit S2 may be defined between adjacent first slits S1. The second slit S2 may have a line shape which extends in the first direction FD. The second slit S2 is provided in only the first and second cell areas CAR1 and CAR2, and is not provided in the connection area CNR. The second slit S2 may divide the stack 10 and the channel structures CH in a unit smaller than memory block BLK in the first and second cell areas CAR1 and CAR2. For example, second slits S2 may divide the stack 10 into a plurality of rows of channel structures CH in first cell area CAR1 and a plurality of rows of channel structures CH in second cell area CAR2.

The distance between adjacent second slits S2 may be a first distance D1. The distance between adjacent first slit S1 and second slit S2 may be a first distance D1. The distance between the first slits S1 may be a second distance D2. In the present embodiment, the second distance D2 may be substantially the same as the width of each memory block BLK in the second direction SD. Because at least one second slit S2 is disposed between adjacent first slits S1 in each of the first and second cell areas CAR1 and CAR2, the first distance D1 between the between adjacent slits S1 and S2 in the first and second cell areas CAR1 and CAR2 is smaller than the second distance D2.

The stack 10 may include an insulation region IS in a central part or region of the connection area CNR that is not adjacent to, and separated from, the first slits S1 and the second slits S2. The insulation region IS may be located in stack 10 at a predetermined distance from the first and second slits S1 and S2. Materials which constitute the stack 10 may be different inside the insulation region IS as compared to materials used outside the insulation region IS.

Referring to FIGS. 3 to 6, inside the insulation region IS, a stack 10 may have a structure in which first dielectric layers 12 and second dielectric layers 14 are alternately stacked on or over a substrate 1. The first dielectric layers 12 and the second dielectric layers 14 may include or be formed from different materials. For example, the first dielectric layers 12 may include a dielectric material for interlayer insulation, and the second dielectric layers 14 may include a dielectric material which has an etching selectivity with respect to the first dielectric layers 12. For example, the first dielectric layers 12 may be silicon oxide layers, and the second dielectric layers 14 may be silicon nitride layers.

Outside the insulation region IS, the stack 10 may have a structure in which the first dielectric layers 12 and electrode layers 16 are alternately stacked on or over substrate 1. The electrode layers 16 may include a conductive material. For example, the electrode layers may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

The electrode layers 16 may correspond to row lines RL described above with reference to FIG. 1. A source select line SSL may include at least one layer of the electrode layers 16 closest to the substrate in the third direction. A drain select line DSL may include at least one layer of the electrode layers 16 furthest away from the substrate in the third direction. Remaining electrode layers 16 between the source select lines SSL and the drain select lines DSL may constitute word lines WL.

In an embodiment, drain select line DSL may be omitted from connection area CNR of a memory block BLK. As examples, the drain select line DSL in connection area CNR may be removed or may be cut such that drain select lines DSL of the first cell area CAR1 and drain select lines DSL of the second cell area CAR2 are separated from each other and not directly and physically connected. However, the source select lines SSL and the word lines WL of the first cell area CAR1 and the corresponding source select lines SSL and the word lines WL of the second cell area CAR2 which are disposed at the same layers (i.e., source select lines SSL and the word lines WL in the same layer in stack 10) may be connected with each other.

In the first and second cell areas CAR1 and CAR2 and in the connection area CNR, first dielectric layers 12 may be stacked and separated from one another vertically in the third direction. Within the insulation region IS, the second dielectric layers 14 may be provided or disposed between the first dielectric layers 12. Outside of the insulation region IS, the electrode layers 16 may be provided or disposed between the first dielectric layers 12. At the boundaries of the insulation region IS, edges of the second dielectric layers 14 and edges of the electrode layers 16 may be in contact with each other in layers disposed at the same vertical position (i.e., in the same layer as counted in the third direction from the substrate).

A first interlayer dielectric layer 20 may be formed on or over a stack 10. The channel structures CH may vertically pass through or penetrate the first interlayer dielectric layer 20 and the stack 10 in the first and second cell areas CAR1 and CAR2.

Each of the channel structures CH may include a channel layer 30 and a gate dielectric layer 32. The channel layer 30 may include polysilicon or monocrystalline silicon, and may include a P-type impurity such as boron (B) in some areas thereof. In some embodiments, the channel layer 30 may have the shape of a solid pillar or cylinder which is completely filled up in its center. In other embodiments not illustrated herein, the channel layer 30 may have hollow a tube-like shape whose central area is open. In such instances, a buried dielectric layer may be formed in the open central area of the channel layer 30.

The gate dielectric layer 32 may have the shape of a straw, tube or cylindrical shell that surrounds the outer wall of the channel layer 30. While not illustrated, the gate dielectric layer 32 may include a tunnel dielectric layer, a charge storage layer and a blocking layer which are sequentially stacked or layered in concentric manner and in an outward direction from the outer wall of the channel layer 30. The tunnel dielectric layer may include silicon oxide, hafnium oxide, aluminum oxide, zirconium oxide or tantalum oxide. The charge storage layer may include silicon nitride, boron nitride, silicon boron nitride or polysilicon doped with an impurity. The blocking layer may include a single layer, or a stacked or multi-layer, that includes silicon oxide, silicon nitride, hafnium oxide, aluminum oxide, zirconium oxide or tantalum oxide or combinations thereof. In some embodiments, the gate dielectric layer 32 may have an ONO (oxide-nitride-oxide) stack structure in which an oxide layer, a nitride layer and an oxide layer are sequentially stacked or layered. Source select transistors, memory cells and drain select transistors may be formed in areas or regions where electrode layers 16 surround channel structures CH.

The first slits S1 may vertically pass through or penetrate the first interlayer dielectric layer 20 and the stack 10 in the first and second cell areas CAR1 and CAR2 and in the connection area CNR.

The second slits S2 may vertically pass through or penetrate the first interlayer dielectric layer 20 and the stack 10 in the first and second cell areas CAR1 and CAR2. In the first and second cell areas CAR1 and CAR2, at least one second slit S2 may be provided between adjacent first slits S1. No second slit S2 is provided in the connection area CNR. The distance between adjacent slits S1 and S2 defined in the first and second cell areas CAR1 and CAR2 may be the first distance D1. The distance between adjacent slits S1 defined in the connection area CNR may be the second distance D2, which larger than the first distance D1.

As will be described later with reference to FIGS. 17A to 20C, after alternately stacking the first dielectric layers 12 and the second dielectric layers 14 on the substrate 1 and forming first slits S1 and second slits S2, the portions of the second dielectric layers 14 may be selectively removed by using a wet etching process. For example, the wet etching process may include injecting, through first slits S1 and second slits S2, an etching solution capable of removing the second dielectric layers 14. As the second dielectric layers 14 are removed, spaces may be formed between the first dielectric layers 12. The electrode layers 16 may be formed by filling the spaces with the conductive material.

Because the etching solution is injected through the slits S1 and S2 in the wet etching process, portions of the second dielectric layers 14 that are closest to the slits S1 and S2 are removed, but other portions of the second dielectric layers 14 that are further away from the slits S1 and S2 might not be etched away and therefore might not be removed. Therefore, because the distance D2 between adjacent slits S1 in the connection area CNR is larger than the distance D1 between adjacent slits S1 and S2 in the cell area CAR, the second dielectric layers 14 may be removed by selective etching from the cell area CAR together with portions of the second dielectric layers 14 in the connection area CNR near or at the periphery of slits S1 and S2 may be removed. However, other portions of the second dielectric layers 14 in the central part or region of the connection area CNR, which are more distant from the slits S1 and slits S2, may remain and are not removed.

The portions of the second dielectric layers 14 that remain may define the boundaries of insulation region IS in the first direction and the second direction. The insulation region IS therefore includes the remaining portions of the second dielectric layers 14 together with the first dielectric layers 12 stacked within the boundaries of the insulation region in the third direction. Put another way, the insulation region IS may be separated from the slits S1 and S2 by a width of the second dielectric layers 14 which are removed in the wet etching process for removing the second dielectric layers 14 of the cell area CAR.

In the central part of the connection area CNR, where the insulation region IS is positioned, one or more contact plugs CP which vertically pass through or penetrate the first interlayer dielectric layer 20 and the stack 10 may be defined or disposed. The contact plugs CP may vertically pass through the first and second dielectric layers 12 and 14 in the insulation region IS.

FIG. 7A is a top view illustrating an example of a semiconductor memory device in accordance with an embodiment of the disclosure, and FIG. 7B is a cross-sectional view taken along the line D-D' of FIG. 7A.

Referring to FIG. 7B, a second interlayer dielectric layer 22 may be defined or disposed on or over the first interlayer dielectric layer 20, and may cover the top surfaces of the channel structures CH and the contact plugs CP. The second interlayer dielectric layer 22 may be formed of silicon oxide.

Referring to FIGS. 7A and 7B, bit lines BL, first wiring lines W1 and second wiring lines W2 may be disposed on the second interlayer dielectric layer 22. For the sake of simplicity, the first wiring lines W1 is not shown in FIG. 7A.

The bit lines BL may extend in the second direction SD in the cell area CAR, and may be arranged to be spaced apart in the first direction FD. While only one bit line BL is illustrated in FIG. 7A for the sake of simplification in illustration, it is to be understood that a plurality of bit lines BL are disposed in the first direction FD. As illustrated in FIG. 7A, each bit line BL may be connected to a column of channel structures CH in a plurality of memory blocks BLK.

Bit line contacts BLC, which pass through or penetrate the second interlayer dielectric layer 22, may be disposed under the bit lines BL in areas common to channel structures CH, and therefore may electrically connect the bit lines BL and the channel layers 30 of the channel structures CH.

First contacts C1, which pass through or penetrate the second interlayer dielectric layer 22, may be defined or disposed in areas common to the contact plugs CP, and therefore may electrically connect the first wiring lines W1 and the contact plugs CP.

A second wiring line W2 may provide an electrical path that connects a drain select line DSL of the first cell area CAR1 and a drain select line DSL of the second cell area CAR2. For example in FIG. 7A, one end of a second wiring line W2 may be connected to a drain select line DSL of the first cell area CAR1 through a second contact C2 of first cell area CAR1 while the other end of the second wiring line W2 may be connected to a drain select line DSL of the second cell area CAR2 through a second contact C2 of second cell area CAR2. Thus, the drain select line DSL of the first cell area CAR1 and the drain select line DSL of the second cell area CAR2 may be part of the same line in the first direction FD. The drain select line DSL of the first cell area CAR1 and the drain select line DSL of the second cell area CAR2 may be connected with each other through the second wiring line W2.

Figure 8A:
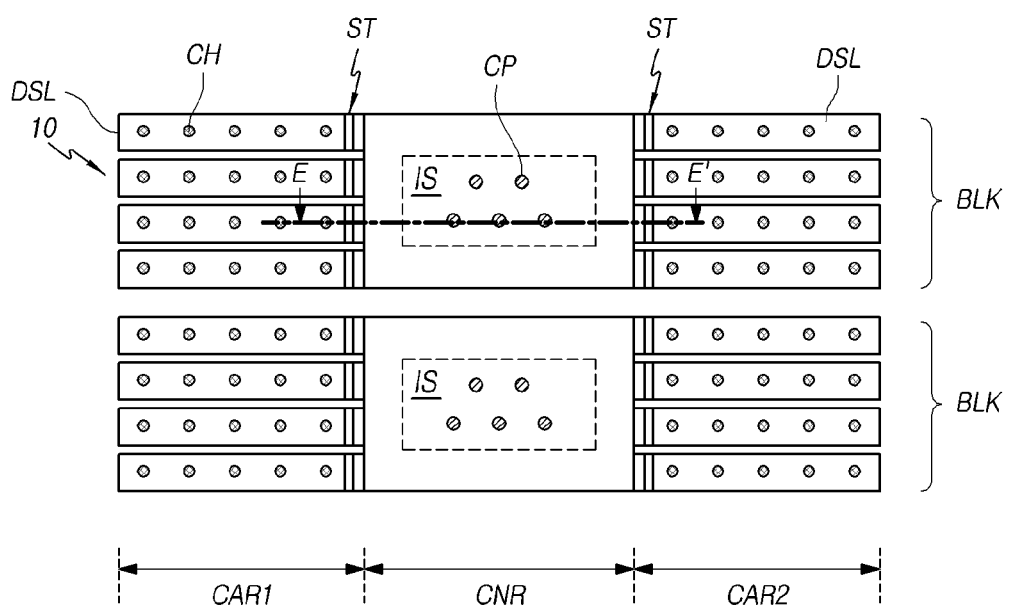
FIG. 8A is a top view illustrating an example of a semiconductor memory device in accordance with an embodiment of the disclosure.
Figure 8B:
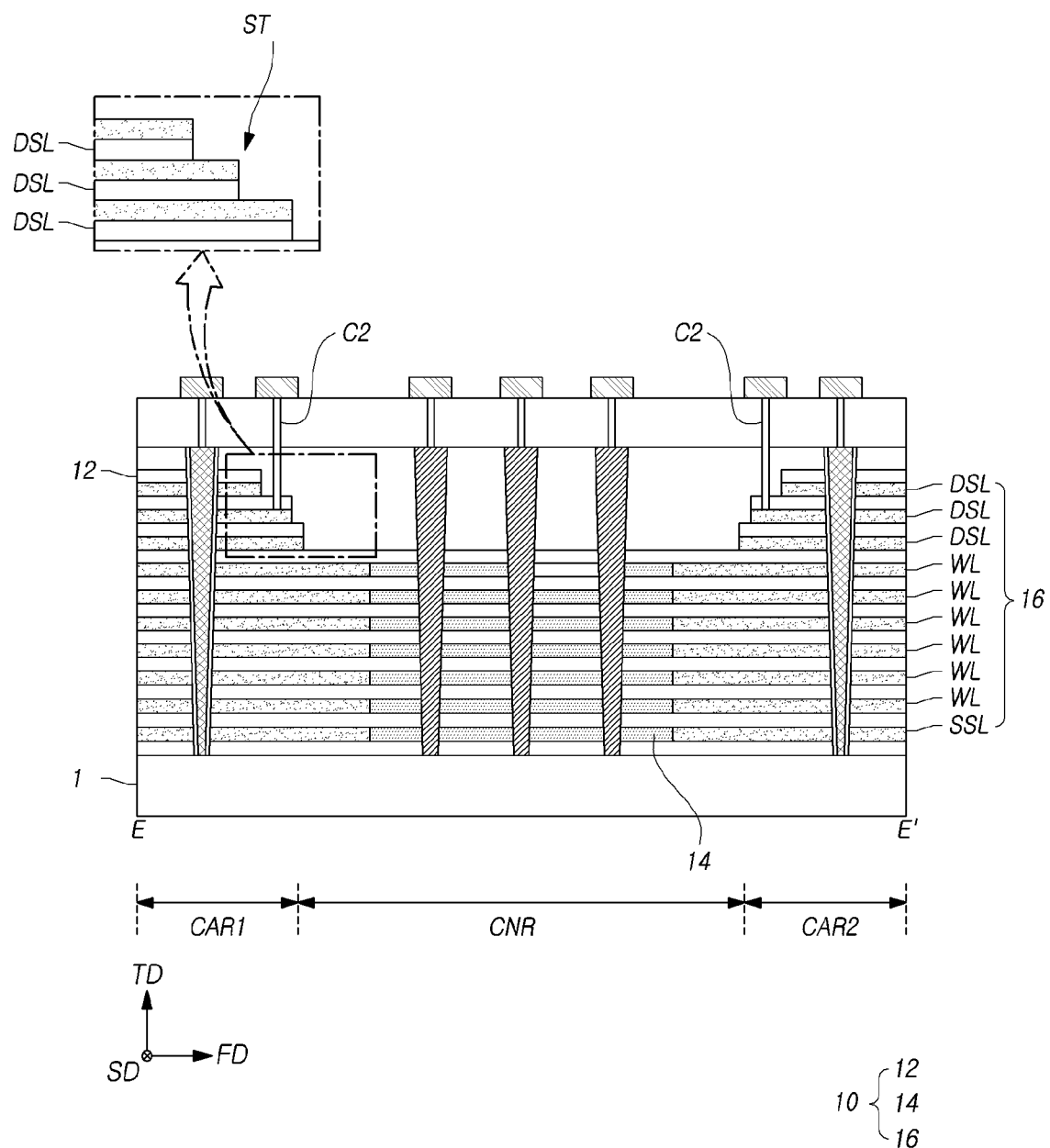
FIG. 8B is a cross-sectional view taken along the line E-E' of FIG. 8A in accordance with an embodiment of the disclosure.

FIG. 8A is a top view illustrating an example of a semiconductor memory device in accordance with an embodiment of the disclosure, and FIG. 8B is a cross-sectional view taken along the line E-E' of FIG. 8A.

Referring to FIG. 8B, a drain select line DSL may include at least one layer of the electrode layers 16 furthest away from the substrate in the third direction. Because the drain select lines DSL are removed in the connection area CNR or omitted from the connection area CNR, the drain select lines DSL of the first cell area CAR1 and the drain select lines DSL of the second cell area CAR2 may be physically separated from each other.

Each of the drain select lines DSL in the first and second cell areas CAR1 and CAR2 may have a pad area created by a drain select line DSL positioned thereon. The stack 10 may have step structures ST which are formed by the staggered pairs of drain select lines and first dielectric lines, and provide pad areas of the drain select lines DSL. A second contact C2 may be connected to a pad area of a drain select line DSL. The step structures ST may be disposed at ends of the first and second cell areas CAR1 and CAR2 adjacent to the connection area CNR. For the sake of simplicity, the wiring lines and bit lines are not shown in FIG. 8A.

Figure 9:
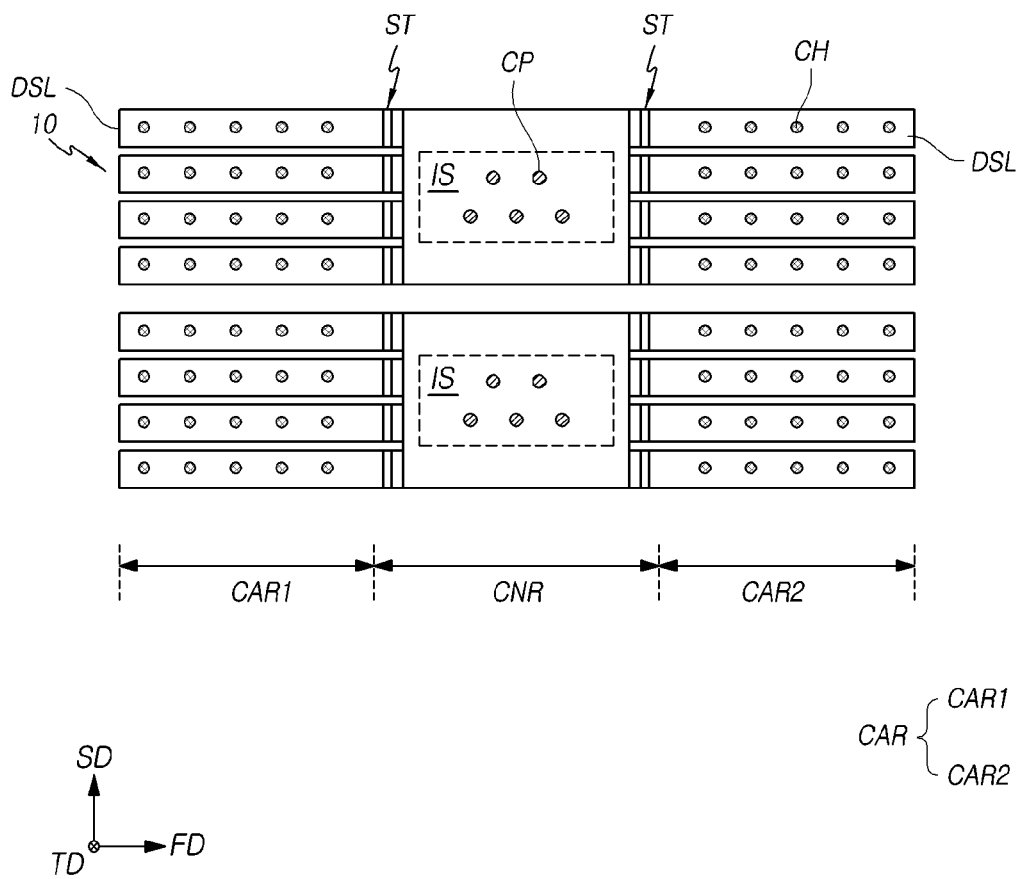
FIGS. 9 and 10 are top views illustrating examples of semiconductor memory devices in accordance with embodiments of the disclosure.
Figure 10:
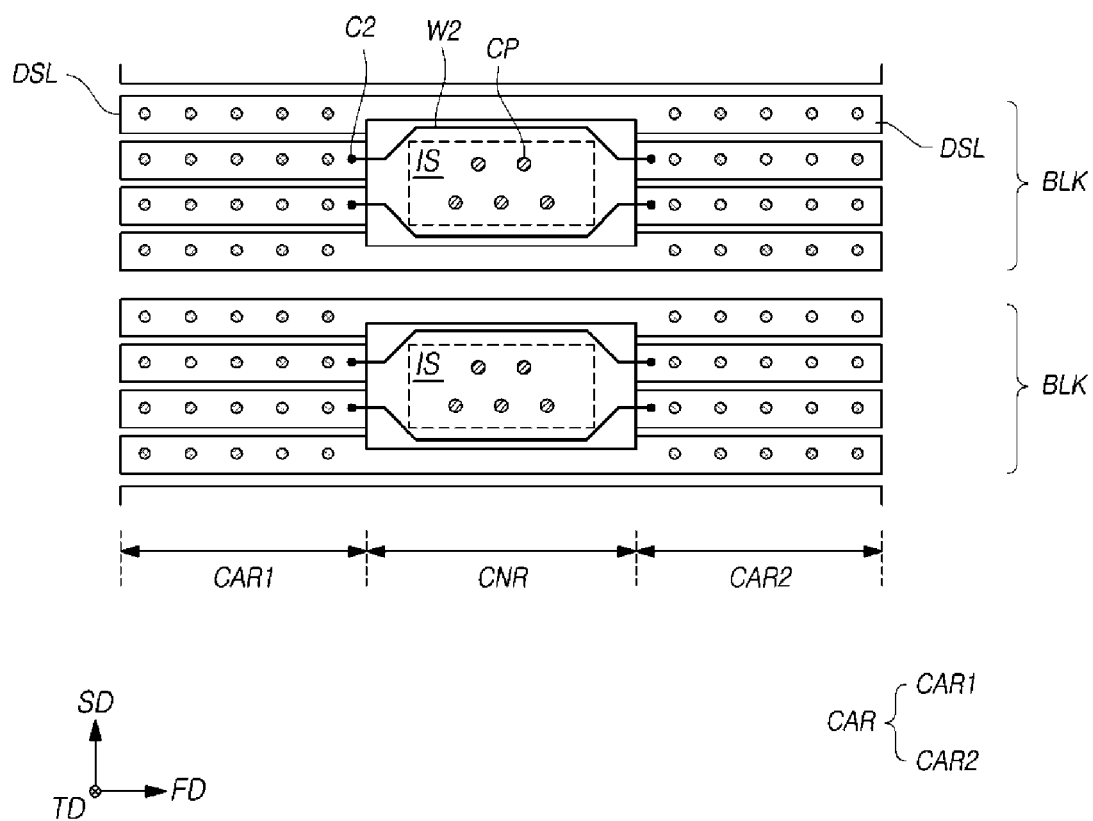

FIGS. 9 and 10 are top views illustrating examples of semiconductor memory devices in accordance with embodiments of the disclosure.

Referring to FIG. 9, more than one uppermost layer of electrode layers 16 are utilized as drain select lines DSL in first cell area CAR1 and second cell area CAR2. Each of the plurality of drain select lines DSL, together with a respective first dielectric layer 12, is staggered relative to each other from first cell area CAR1 and second cell area CAR2 into connection area CNR. Thus, the stack 10 may have step structures ST which are formed by the staggered pairs of drain select lines DSL and first dielectric lines, and provide a pad area of a drain select line DSL in connection area CNR. A second contact C2 may be connected to a pad area of a drain select line DSL in connection area CNR. The drain select lines DSL may extend beyond the boundaries with the connection area CNR from the first and second cell areas CAR1 and CAR2. The drain select lines DSL may extend by different lengths, and thereby, in the connection area CNR, each of the drain select lines DSL may have a pad area which is exposed by another drain select line DSL positioned thereon. The stack 10 may have step structures ST which are provided by the pad areas of the drain select lines DSL at ends of the connection area CNR adjacent to the first and second cell areas CAR1 and CAR2.

In embodiments of the disclosure, because step structures ST are not disposed in the cell area CAR but are disposed in the connection area CNR, such memory devices avoid the loss of the cell area CAR due to the presence of the step structures ST. Therefore, such memory devices have additional area capable of being used for disposition of memory cells in the cell area CAR, and the increase in the number of memory cells may contribute to improvements in the degree of integration.

Referring to FIG. 10, in an embodiment, portions of the drain select lines DSL are omitted only in areas common to the insulation region IS. Portions of the drain select lines DSL which are not disposed in the insulation region IS are not removed. Due to this fact, some of the drain select lines DSL may not be cut in the connection area CNR, and physically extend from first cell area CAR1 through connection area CNR to second cell area CAR2.

Some drain select lines DSL may extend to the second cell area CAR2 across the connection area CNR from the first cell area CAR1. In some embodiments, drain select lines DSL do not utilize second wiring lines W2 and second contacts C2.

Accordingly, because the numbers of the second wiring lines W2 and the second contacts C2 may be reduced or limited, memory devices of the disclosure avoid forming a large number of wiring lines and contacts within a limited area, which can result in process failures. In embodiments contemplated by the disclosure, the margins of processes for forming the second wiring lines W2 and the second contacts C2 may be improved, thereby suppressing or preventing a process failure.

Figure 11:
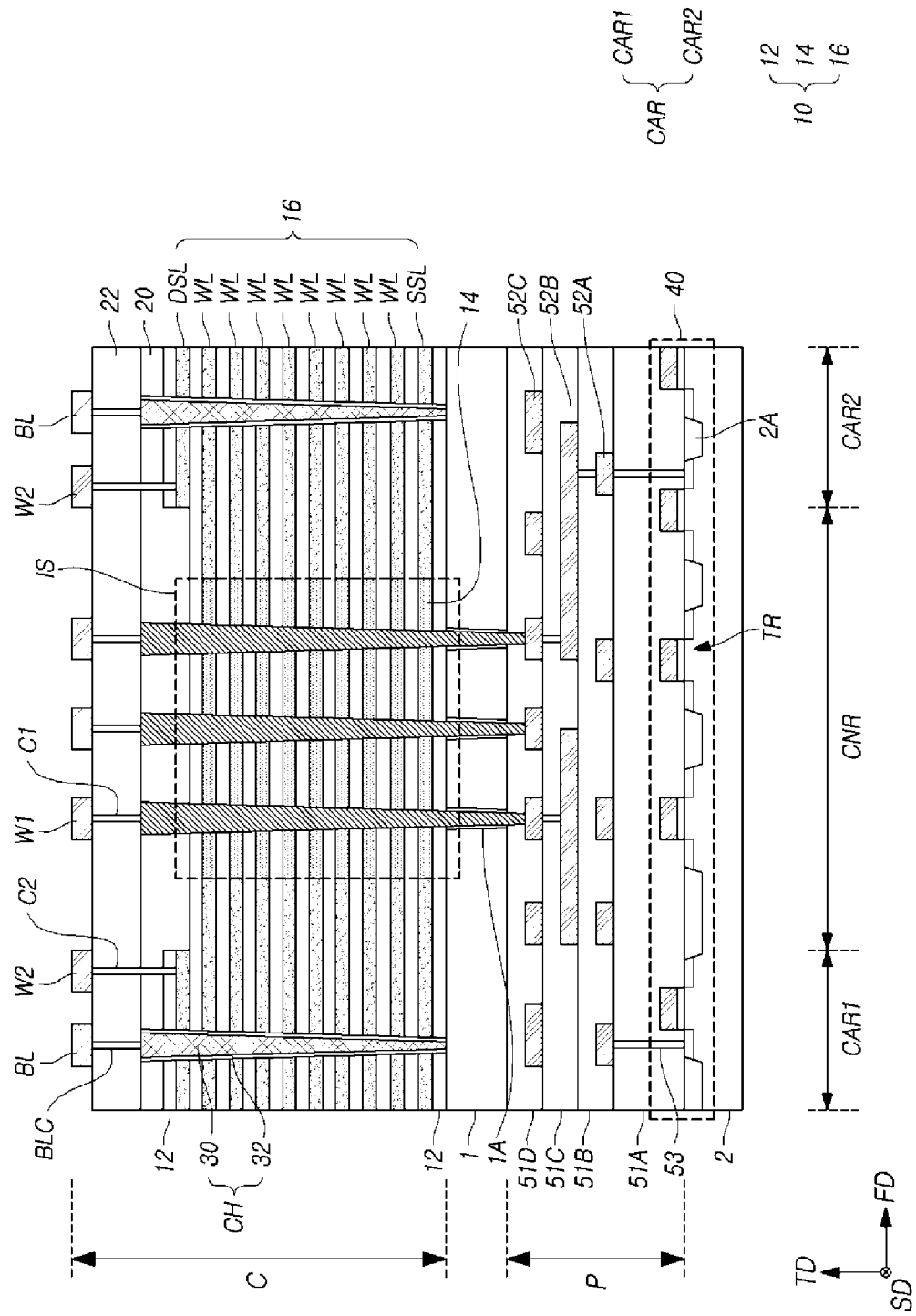
FIG. 11 is a cross-sectional view illustrating an example of a semiconductor memory device in accordance with an embodiment of the disclosure.

FIG. 11 is a cross-sectional view illustrating an example of a semiconductor memory device in accordance with an embodiment of the disclosure.

Referring to FIG. 11, the semiconductor memory device may have a PUC (peri under cell) structure. A logic structure P including the row decoder 121, the page buffer circuit 122 and the peripheral circuit 123 of FIG. 1 may be disposed under a memory structure C.

The structure of the memory structure C may be substantially the same as that described above with reference to FIGS. 3 through 7B.

The logic structure P may include a logic circuit 40 which is disposed on a second substrate 2. The second substrate 2 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic circuit 40 may include transistors TR which are disposed on active areas defined by an isolation layer 2A. While not illustrated, the logic circuit 40 may further include capacitors, inductors, and so forth. The logic circuit 40 may constitute the row decoder 121, the page buffer circuit 122 and the peripheral circuit 123 of FIG. 1.

Interlayer dielectric layers 51A to 51D may be defined on the second substrate 2, and thereby, may cover the logic circuit 40. The interlayer dielectric layers 51A to 51D may include third through sixth interlayer dielectric layers 51A to 51D which are sequentially stacked or layered. The third to sixth interlayer dielectric layers 51A to 51D may include silicon oxide, such as for example, HDP oxide or TEOS oxide.

Wiring lines 52A through 52C may be disposed on the third through fifth interlayer dielectric layers 51A through 51C, respectively. The wiring lines 52A through 52C may include third wiring lines 52A which are disposed on the third interlayer dielectric layer 51A, fourth wiring lines 52B which are disposed on the fourth interlayer dielectric layer 51B and fifth wiring lines 52C which are disposed on the fifth interlayer dielectric layer 51C. Contacts 53 may pass through or penetrate the third, fourth and fifth interlayer dielectric layers 51A to 51C, and thereby, may electrically connect the logic circuit 40 and the third wiring lines 52A, and may electrically connect the wiring lines 52A, 52B, and 52C which are disposed on different layers.

The contact plugs CP may pass through or penetrate the first interlayer dielectric layer 20, the first and second dielectric layers 12 and 14 of the insulation region IS and the first substrate 1, and thereby, may be connected to the logic structure P. The contact plugs CP may pass through or penetrate the sixth interlayer dielectric layer 51D of the logic structure P, and thereby, may be connected to the fifth wiring lines 52C. Sidewall dielectric layers 1A may be formed between the contact plugs CP and the first substrate 1, and thereby, may electrically isolate the contact plugs CP from the first substrate 1. The sidewall dielectric layers 1A may have the shape of a straw, a tube or a cylinder shell which surrounds the contact plugs CP between the contact plugs CP and the first substrate 1. The sidewall dielectric layers 1A may be formed of silicon oxide.

Figure 12:
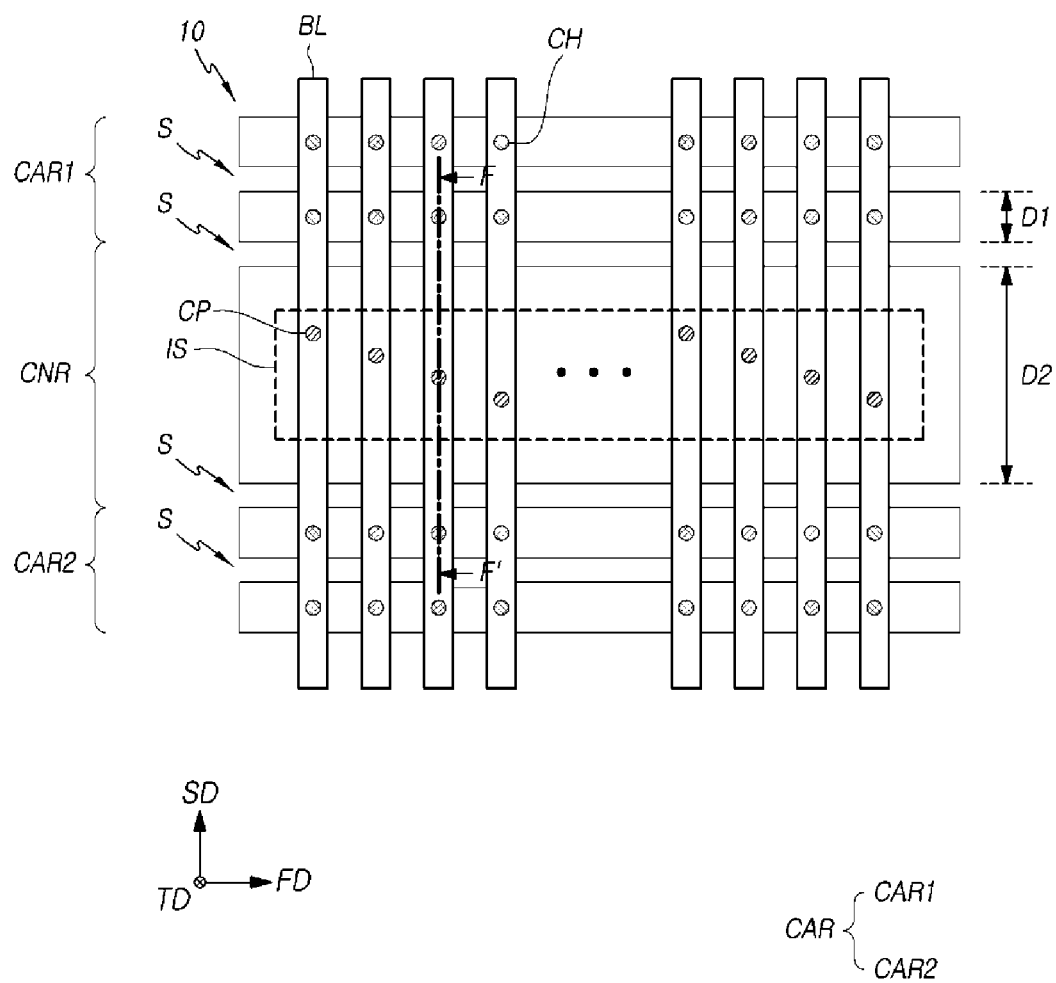
FIG. 12 is a top view illustrating an example of a semiconductor memory device in accordance with an embodiment of the disclosure.
Figure 13:
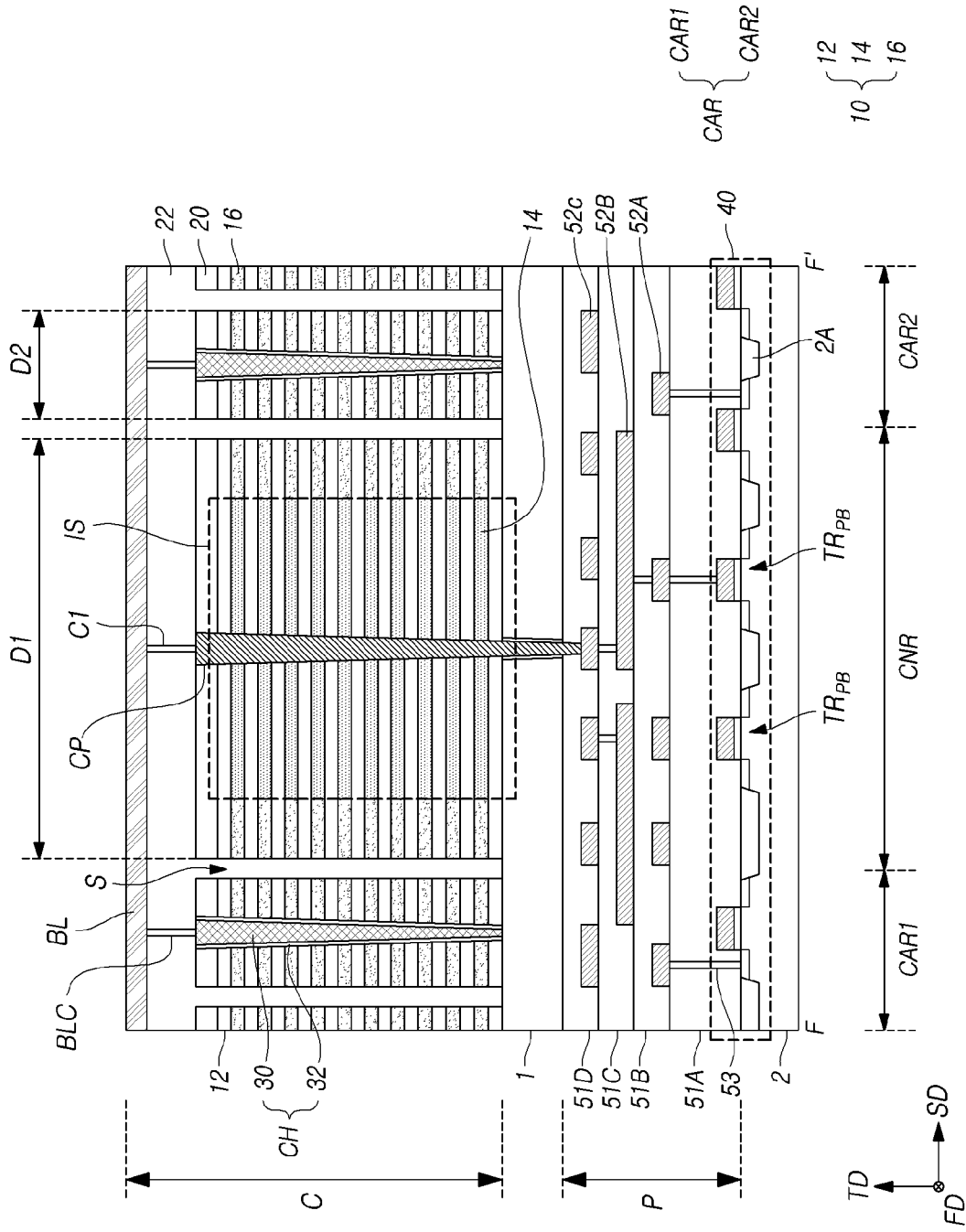
FIG. 13 is a cross-sectional view taken along the line F-F' of FIG. 12 in accordance with an embodiment of the disclosure.

FIG. 12 is a top view illustrating an example of a semiconductor memory device in accordance with an embodiment of the disclosure, and FIG. 13 is a cross-sectional view taken along the line F-F' of FIG. 12.

Referring to FIG. 12, a semiconductor memory device may include a cell area CAR and a connection area CNR. The cell area CAR may include a first cell area CAR1 and a second cell area CAR2, which are disposed to be spaced apart in the second direction SD. The connection area CNR may be disposed between the first cell area CAR1 and the second cell area CAR2.

A stack 10 may be disposed in the first and second cell areas CAR1 and CAR2 and the connection area CNR. A plurality of channel structures CH, which vertically pass (i.e., extend in a third direction) through the stack 10, may be defined or disposed in the first and second cell areas CAR1 and CAR2.

Slits S, which extend in the first direction FD, may divide the stack 10 into a plurality of parts. Slits S may be gaps or areas of separation within first cell area CAR1, second cell area CAR2 and the connection area CNR, or gaps or areas of separation between connection area CNR and first cell area CAR1 or between connection area CNR and second cell area CAR2. The distance between the slits S in the first and second cell areas CAR1 and CAR2 may be a first distance D1. The distance between the slits S in the connection area CNR may be a second distance D2, and the second distance D2 may be larger than the first distance D1. The stack 10 may have an insulation region IS at a central part or region of the connection area CNR which is not adjacent to, and separated from the slits S. The boundaries of insulation region IS in the first direction and in the second direction are inset from the edges of connection area CNR in the first direction and in the second direction. Put another way, the boundaries of insulation region IS and boundaries of connection area CNR in the first direction and in the second direction are offset from each other, with the boundaries of insulation region IS inside of the boundaries of connection area CNR.

Bit lines BL may be disposed on or over the stack 10. The bit lines BL may extend in the second direction SD, and may be arranged to be spaced apart in the first direction FD. The bit lines BL may be connected to the channel structures CH through bit line contacts BLC (see FIG. 13). Channel structures CH which are disposed in a line or a column in the second direction SD may be connected in common to one bit line BL. Contact plugs CP which vertically pass through or penetrate the stack 10 may be defined or disposed in the insulation region IS.

Materials which constitute the stack 10 may be different inside the insulation region IS than materials that are used in stack 10 outside the insulation region IS.

Referring to FIGS. 12 and 13, inside the insulation region IS, the stack 10 may have a structure in which first dielectric layers 12 and second dielectric layers 14 are alternately stacked on or over substrate 1. The first dielectric layers 12 and the second dielectric layers 14 may include or be formed from different materials. For example, the first dielectric layers 12 may include a dielectric material for interlayer insulation, and the second dielectric layers 14 may include a dielectric material which has an etching selectivity with respect to the first dielectric layers 12. For example, the first dielectric layers 12 may be silicon oxide layers, and the second dielectric layers 14 may be silicon nitride layers.

Outside the insulation region IS, the stack 10 may have a structure in which the first dielectric layers 12 and electrode layers 16 are alternately stacked. The electrode layers 16 may include a conductive material. For example, the electrode layers 16 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

A first interlayer dielectric layer 20 may be formed on or over the stack 10. The channel structures CH may vertically pass through or penetrate the first interlayer dielectric layer 20 and the stack 10.

A second interlayer dielectric layer 22 may be defined or disposed on or over the first interlayer dielectric layer 20, and may cover the top surfaces of the channel structures CH and the contact plugs CP and fill the slits S.

The bit lines BL may be disposed on the second interlayer dielectric layer 22. The bit lines BL may be connected to channel layers 30 of the channel structures CH through the bit line contacts BLC which pass through or penetrate the second interlayer dielectric layer 22 under the bit lines BL in areas common to channel structures CH. The bit lines BL may be connected to the contact plugs CP through first contacts C1 which pass through the second interlayer dielectric layer 22 under the bit lines BL in areas common to contact plugs CP.

The semiconductor memory device may have a PUC structure. A logic structure P including the row decoder 121, the page buffer circuit 122 and the peripheral circuit 123 of FIG. 1 may be disposed under a memory structure C.

The logic structure P may include a logic circuit 40 which is disposed on a second substrate 2. The logic circuit 40 may include transistors $TR_{PB}$ which are disposed on active areas defined by an isolation layer 2A. The transistors $TR_{PB}$ which are disposed in the connection area CNR may constitute the page buffer circuit 122.

While not illustrated in detail, the transistors $TR_{PB}$ which constitute the page buffer circuit 122 may be disposed and spaced apart in the first direction FD similar to the arrangement of the bit lines BL in the connection area CNR. At least some of the transistors $TR_{PB}$ which constitute the page buffer circuit 122 may vertically overlap with the insulation region IS in the connection area CNR (i.e., some of the transistors $TR_{PB}$ are under insulation region IS).

The contact plugs CP may pass through or penetrate the first interlayer dielectric layer 20, the first and second dielectric layers 12 and 14 of the insulation region IS, a first substrate 1 and a sixth interlayer dielectric layer 51D, and thereby may be connected to fifth wiring lines 52C which are electrically connected to the transistors $TR_{PB}$ through the first substrate 1. The contact plugs CP may provide electrical paths which connect the bit lines BL and the page buffer circuit 122.

Figure 14:
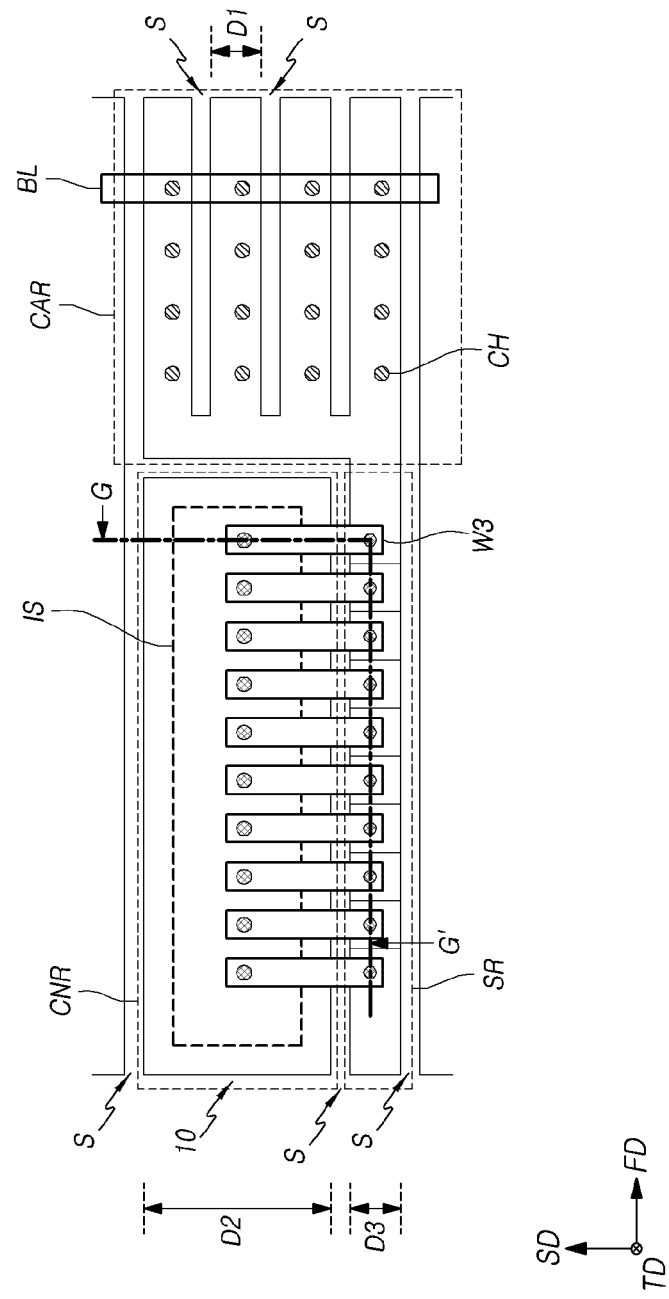
FIG. 14 is a top view illustrating an example of a semiconductor memory device in accordance with an embodiment of the disclosure.
Figure 15:
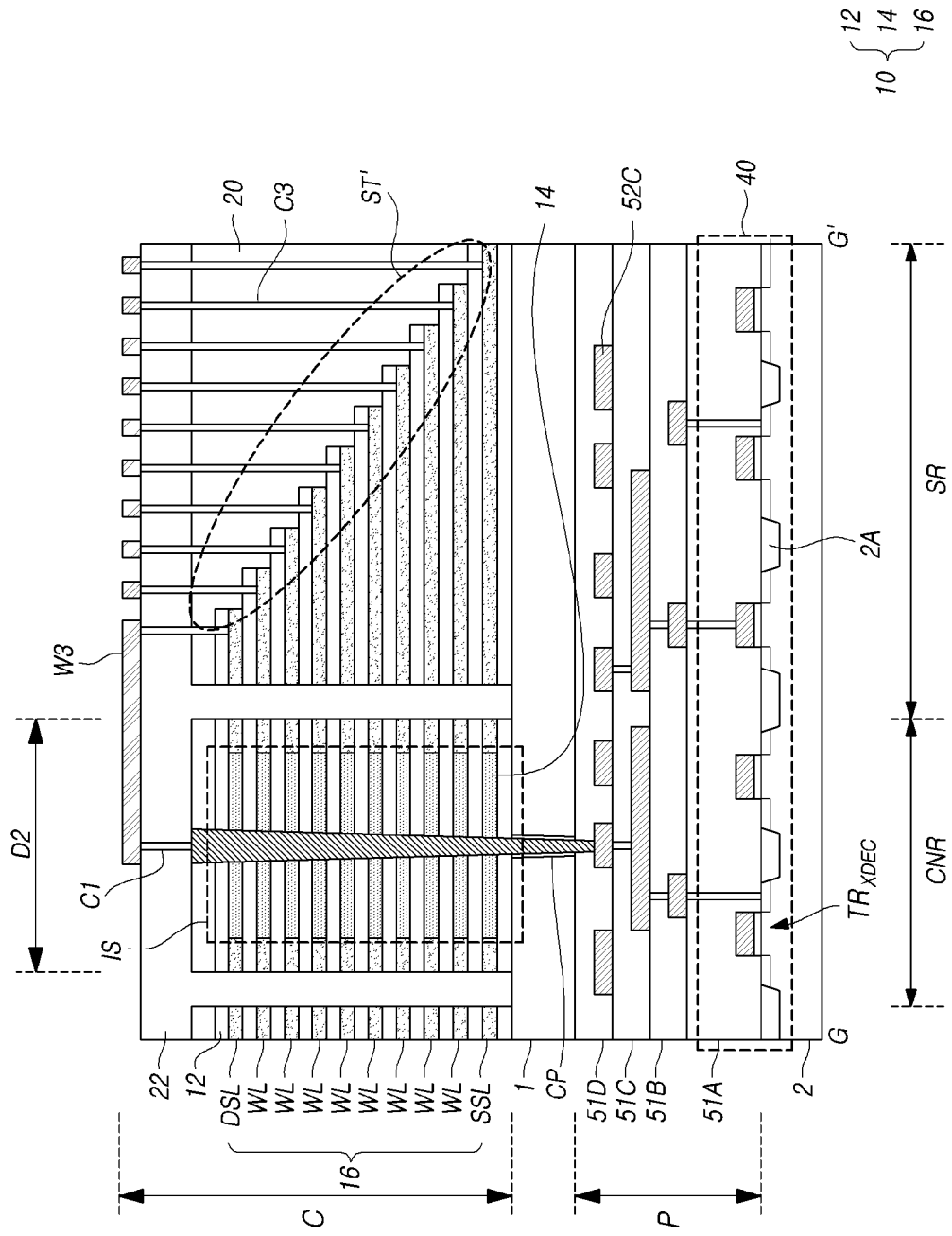
FIG. 15 is a cross-sectional view taken along the line G-G' of FIG. 14 in accordance with an embodiment of the disclosure.

FIG. 14 is a top view illustrating an example of a semiconductor memory device in accordance with an embodiment of the disclosure, and FIG. 15 is a cross-sectional view taken along the line G-G' of FIG. 14.

Referring to FIG. 14, a semiconductor memory device may include a cell area CAR, a connection area CNR, and a slimming area SR. The connection area CNR and the slimming area SR may be disposed to be spaced apart in the second direction SD. The cell area CAR may be disposed adjacent to the connection area CNR and the slimming area SR in the first direction FD. The width of the cell area CAR in the second direction SD may be greater than both the width of the connection area CNR in the second direction SD and the width of the slimming area SR in the second direction SD.

A stack 10 may be disposed on or over a substrate (not illustrated) that spans in the cell area CAR, the connection area CNR and the slimming area SR. A plurality of channel structures CH, which is pass through or penetrate the stack 10 in a vertical direction (i.e., in the third direction), may be defined or disposed in the stack 10 in the cell area CAR.

Slits S may divide the stack 10 into a plurality of parts, namely, the stack 10 in the cell area CAR, the stack 10 in connection area CNR and the stack 10 in slimming area SR. Additional slits S may separate rows of channel structures CH in the first direction in the cell area CAR.

The distance between the slits S in the cell area CAR may be a first distance D1. The distance between the slits S in connection area CNR may be a second distance D2. The distance between the slits S in the slimming area SR may be a third distance D3. The second distance D2 is larger than the first distance D1 and larger than the third distance D3.

The stack 10 may have an insulation region IS at a central part or region of the connection area CNR which is separated from the slits S. The boundaries of insulation region IS in the first direction and in the second direction are inset from the edges of connection area CNR in the first direction and in the second direction. Put another way, the boundaries of insulation region IS and boundaries of connection area CNR in the first direction and in the second direction are offset from each other, with the boundaries of insulation region IS inside of the boundaries of connection area CNR. Materials which constitute the stack 10 may be different inside the insulation region IS than materials used in stack 10 outside the insulation region IS.

Referring to FIGS. 14 and 15, inside the insulation region IS, the stack 10 may have a structure in which first dielectric layers 12 and second dielectric layers 14 are alternately stacked on or over substrate 1. The first dielectric layers 12 and the second dielectric layers 14 may include or be formed from different materials. For example, the first dielectric layers 12 may include a dielectric material for interlayer insulation, and the second dielectric layers 14 may include a dielectric material which has an etching selectivity with respect to the first dielectric layers 12. For example, the first dielectric layers 12 may be silicon oxide layers, and the second dielectric layers 14 may be silicon nitride layers.

Outside the insulation region IS, the stack 10 may have a structure in which the first dielectric layers 12 and electrode layers 16 are alternately stacked. The electrode layers 16 may include a conductive material. For example, the electrode layers 16 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

A source select line SSL may include at least one layer of the electrode layers 16 closest to the substrate in the third direction. A drain select line DSL may include at least one layer of the electrode layers 16 furthest away from the substrate in the third direction. Remaining electrode layers 16 between the source select lines SSL and the drain select lines DSL may constitute word lines WL.

Pairs of electrode layers 16 and respective first dielectric layers 12 may extend by different lengths from the cell area CAR to the slimming area SR. Put another way, the ends or edges of pairs of electrode layers 16 and respective first dielectric layers 12 may be staggered in the first direction from slimming area SR to cell area CAR. In the slimming area SR, each of the electrode layers 16 may have a pad area formed by another electrode layer 16 positioned thereon. Thus, in the slimming area SR, the stack 10 may have a step structure ST' which is defined by the stepped pad areas of the electrode layers 16.

Third contacts C3 may be disposed on the pad areas of the electrode layers 16. The third contacts C3 may pass, in a vertical direction, through second and first interlayer dielectric layers 22 and 20 and the first dielectric layers 12 on the pad areas, and may be connected to the electrode layers 16. Third wiring lines W3 may be defined or disposed on the second interlayer dielectric layer 22, and may be connected to the third contacts C3.

The semiconductor memory device may have a PUC structure. A logic structure P including the row decoder 121, the page buffer circuit 122 and the peripheral circuit 123 of FIG. 1 may be disposed under a memory structure C including the memory cell array 110.

The logic structure P may include a logic circuit 40 which is disposed on a second substrate 2. The logic circuit 40 may include a plurality of transistors which are disposed on active areas defined by an isolation layer 2A. The transistors may include pass transistors $TR_{XDEC}$ which constitute the row decoder 121. At least some of the pass transistors $TR_{XDEC}$ may vertically overlap with the insulation region IS in the connection area CNR (i.e., some of the pass transistors $TR_{XDEC}$ are under insulation region IS).

Contact plugs CP may pass through or penetrate the first interlayer dielectric layer 20, the first and second dielectric layers 12 and 14 of the insulation region IS, a first substrate 1 and a sixth interlayer dielectric layer 51D, and thereby, may be connected to fifth wiring lines 52C which in turn are connected to the pass transistors $TR_{XDEC}$. The contact plugs CP may provide electrical paths which connect the electrode layers 16 and the pass transistors $TR_{XDEC}$.

Figure 16A:
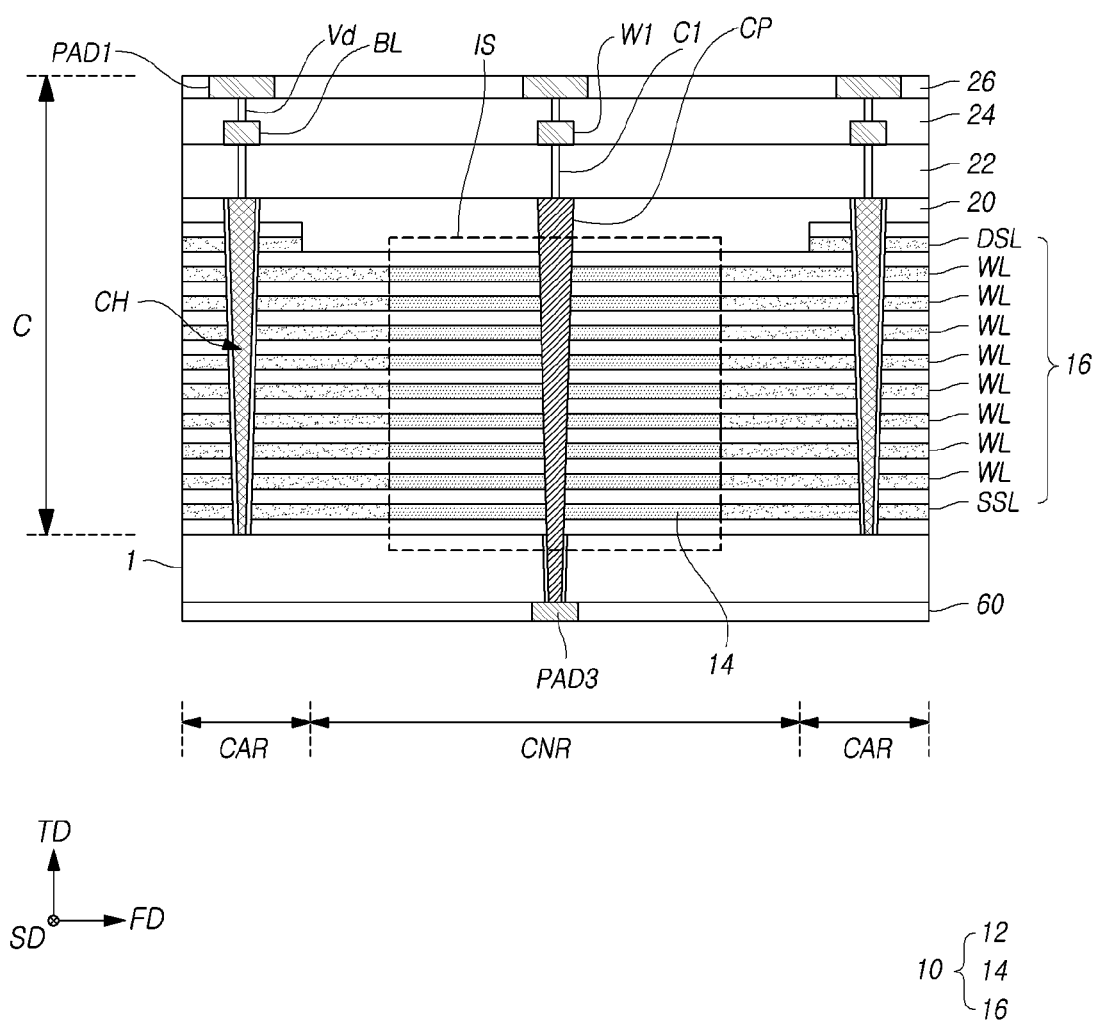
FIGS. 16A to 16C are illustrations of cross-sectional views to assist in the explanation of a semiconductor memory device in accordance with an embodiment of the disclosure.
Figure 16B:
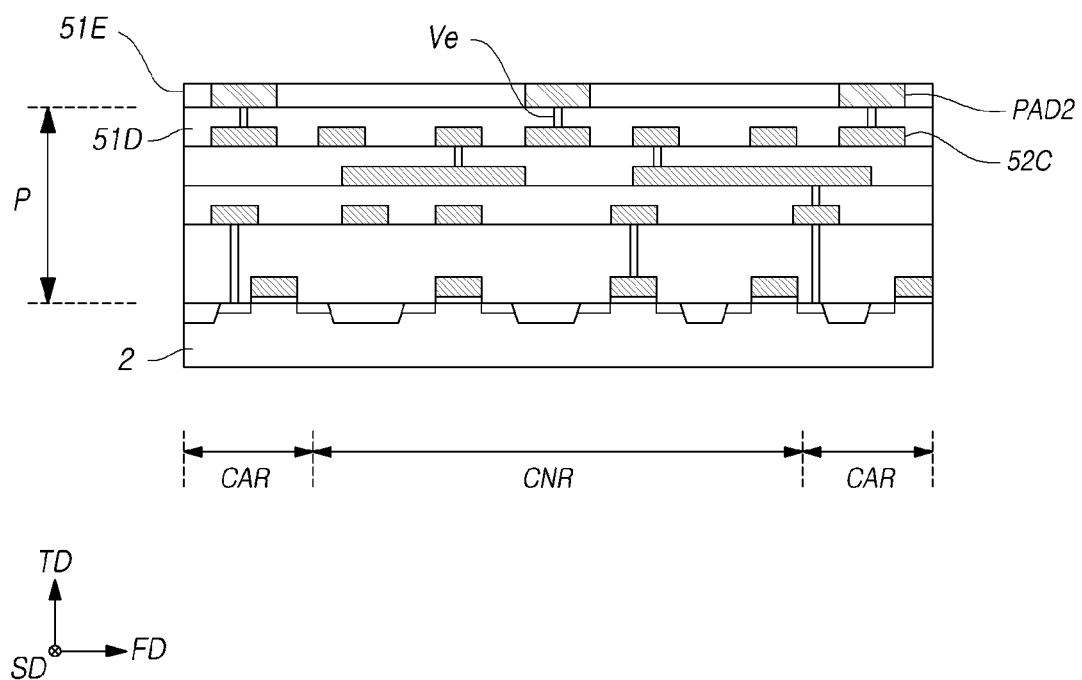
Figure 16C:
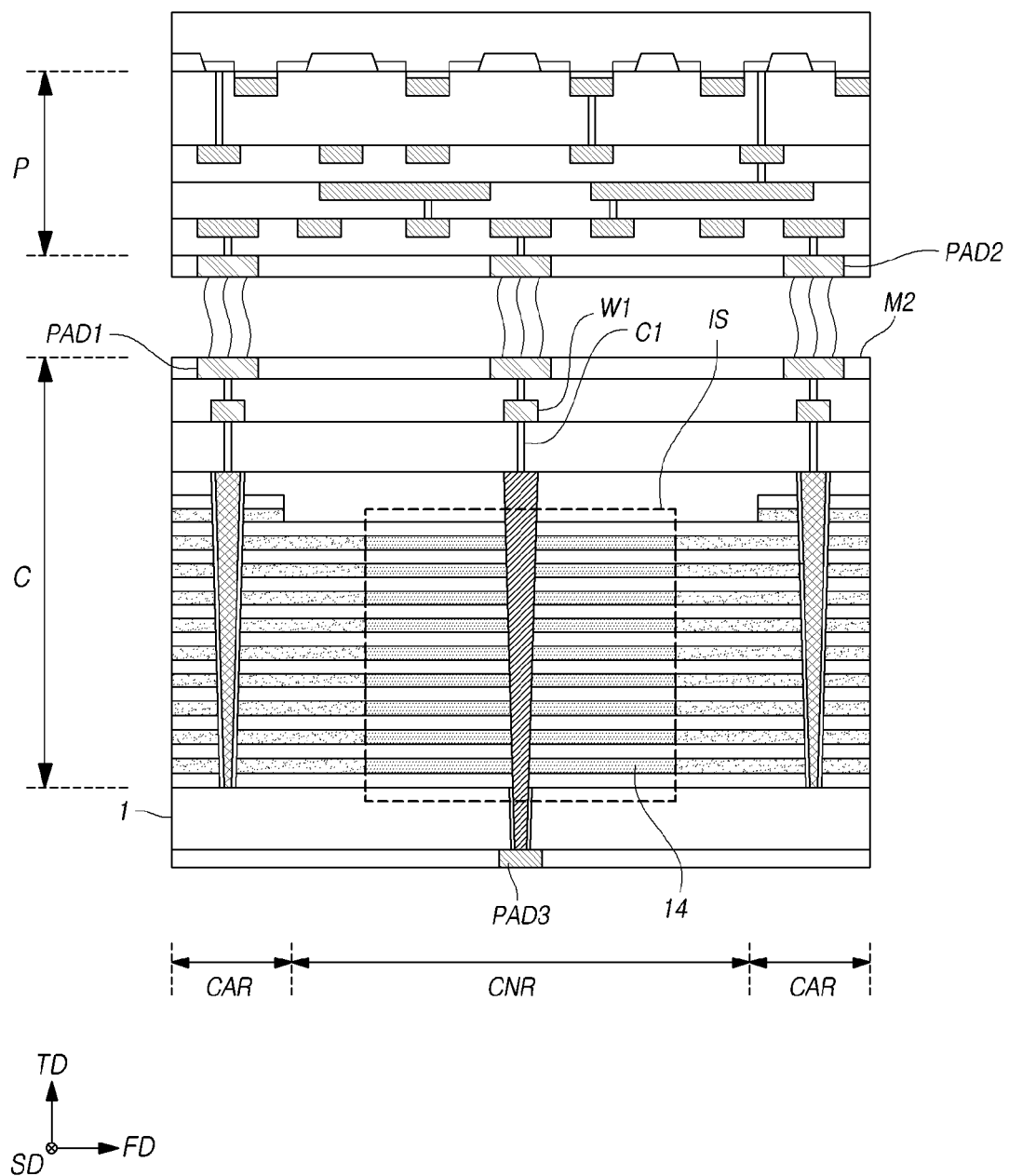

FIGS. 16A to 16C are illustrations of cross-sectional views to assist in the explanation of a semiconductor memory device in accordance with an embodiment of the disclosure.

Referring to FIG. 16A, a dielectric layer 24 may be defined or disposed on the second interlayer dielectric layer 22, and may cover the bit lines BL and the wiring lines W1. While FIG. 16A illustrates only the bit lines BL and the wiring lines W1 which are connected to the contact plugs CP, it is to be noted that a plurality of wiring lines including wiring lines that are connected to the electrode layers 16 may be defined or disposed on the second interlayer dielectric layer 22. First pads PAD1, which are connected to the bit lines BL and the wiring lines W1 through vertical vias Vd, may be defined or disposed on the dielectric layer 24. A dielectric layer 26 may be formed on the dielectric layer 24, and may expose the top surfaces of the first pads PAD1 while covering the side surfaces of the first pads PAD1.

Referring to FIGS. 16A and 16B, a second pads PAD2 may be defined on the sixth interlayer dielectric layer 51D of the logic structure P. The second pads PAD2 may correspond to the first pads PAD1 of the memory structure C. Vertical vias Ve which pass through or penetrate the sixth interlayer dielectric layer 51D may be formed under the second pads PAD2, and thereby, may connect the second pads PAD2 and the fifth wiring lines 52C. A dielectric layer 51E may be defined on the sixth interlayer dielectric layer 51D, and thereby, may expose the top surfaces of the second pads PAD2 and while covering the side surfaces of the second pads PAD2.

Referring back to FIG. 16A, third pads PAD3 which are connected to the contact plugs CP may be disposed on the bottom surface of the first substrate 1. While not illustrated, a dielectric layer may be defined or disposed common to the bottom surface of the first substrate 1, and may isolate the third pads PAD3 and the first substrate 1. A protective layer 60 may be formed on the bottom surface of the first substrate 1, and thereby, may expose the top surfaces of the third pads PAD3 and cover the side surfaces of the third pads PAD3.

Referring to FIG. 16C, the structure illustrated in FIG. 16B may be turned upside down such that the second pads PAD2 face the first pads PAD1, and then, may be stacked on the structure illustrated in FIG. 16A. As the second pads PAD2 and the first pads PAD1 corresponding thereto are connected with each other, electrical paths which connect the memory cells included in the memory structure C and the logic circuit of the logic structure P may be formed.

According to embodiments of the disclosure, a logic structure P may be disposed over a memory structure C. A semiconductor device having such a structure may be defined as a POC (peri over cell) structure.

FIGS. 17A to 20C are examples of views to assist in the explanation of a method for manufacturing a semiconductor memory device in accordance with an embodiment of the disclosure. In detail, FIGS. 17A to 20A represent top views to assist in the explanation of the method for manufacturing a semiconductor memory device in accordance with the embodiment of the disclosure. FIGS. 17B to 20B are cross-sectional views taken along the lines H-H' of FIGS. 17A to 20A respectively, and FIGS. 17C to 20C are cross-sectional views taken along the lines I-I' of FIGS. 17A to 20A, respectively.

Figure 17B:
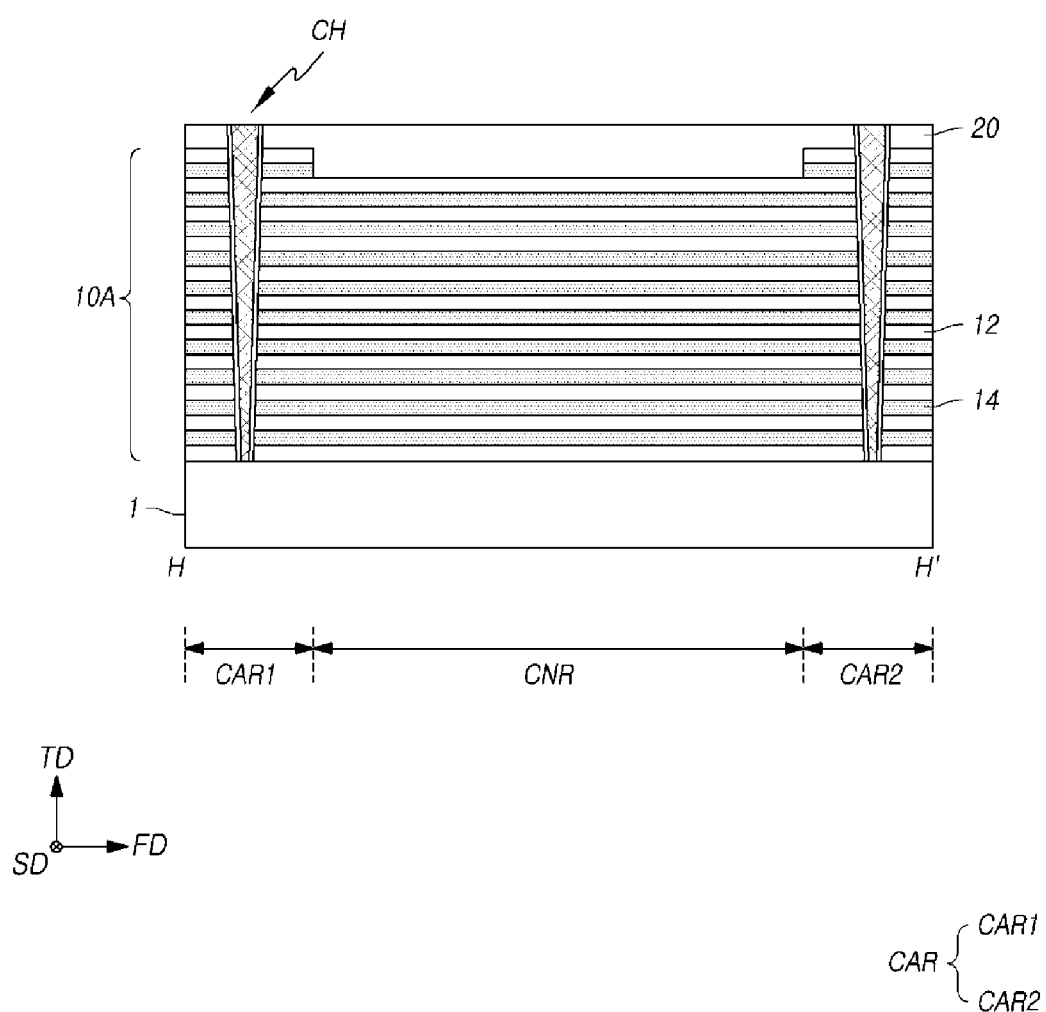
Figure 17C:
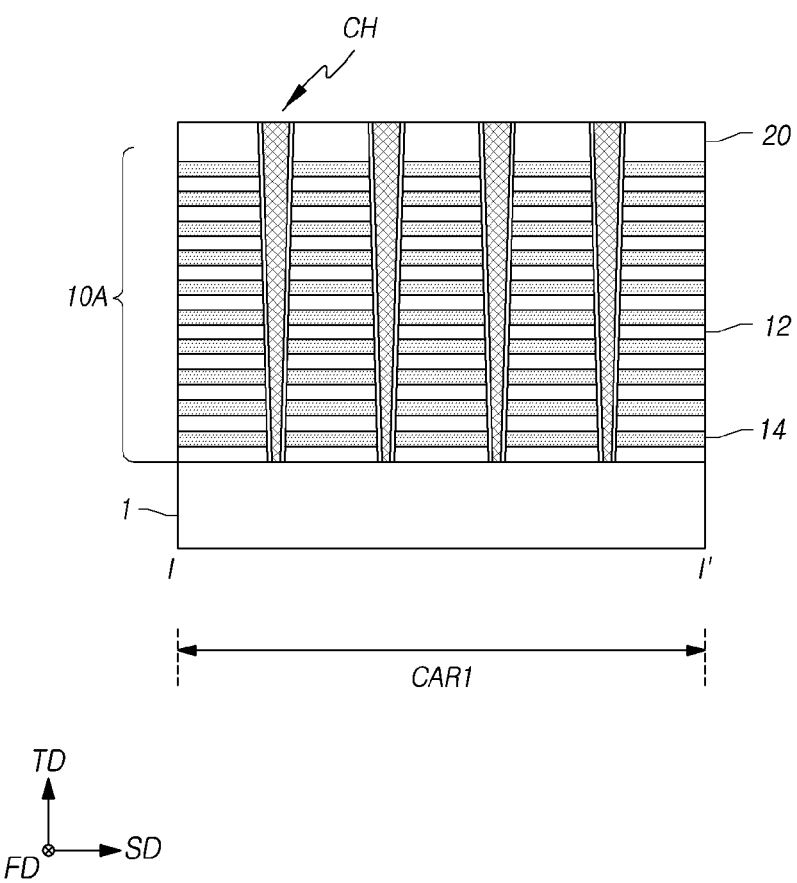

Referring to FIGS. 17A to 17C, first dielectric layers 12 and second dielectric layers 14 may be alternately stacked on or over a substrate 1, which is defined with or divided into a cell area CAR and a connection area CNR, and thereby, a pre-stack 10A may be formed.

The substrate 1 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The first dielectric layers 12 and the second dielectric layers 14 may be formed of different materials. For example, the first dielectric layers 12 may be formed of a dielectric material for interlayer insulation, and the second dielectric layers 14 may be formed of a dielectric material which is used as sacrificial layers and has an etching selectivity with respect to the first dielectric layers 12. For example, the first dielectric layers 12 may be formed as silicon oxide layers, and the second dielectric layers 14 may be formed as silicon nitride layers.

The uppermost first dielectric layer 12 and the uppermost second dielectric layer 14 of the connection area CNR may be removed by a photolithography process. The remaining uppermost second dielectric layer 14 may be subsequently replaced with a conductive material, and may be used as or constitute drain select lines. Although the present embodiment illustrates that only the uppermost second dielectric layer 14 is etched, it is to be noted that in other embodiments at least two second dielectric layers 14 from the top of pre-stack 10A may be etched.

A first interlayer dielectric layer 20 which covers the pre-stack 10A may be formed on or over the substrate 1. The first interlayer dielectric layer 20 may be formed as a silicon oxide layer. Channel structures CH which vertically pass through or penetrate the first interlayer dielectric layer 20 and the pre-stack 10A may be formed.

Figure 18A:
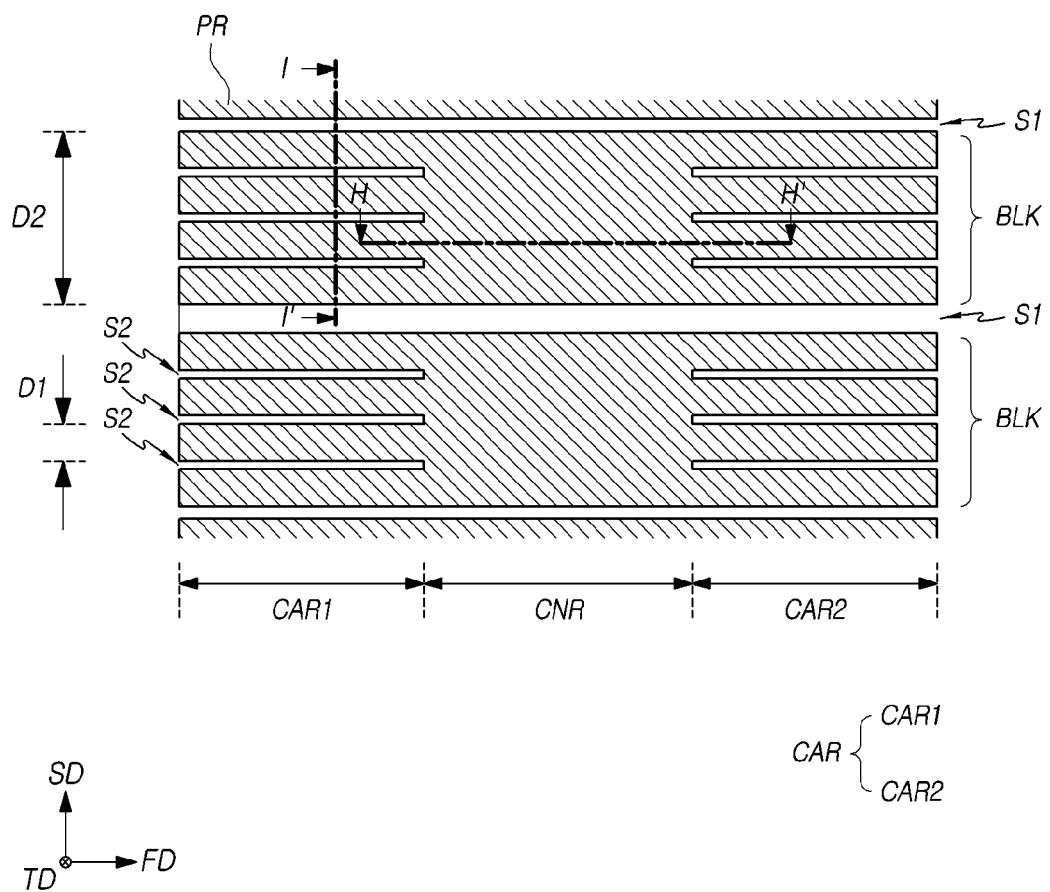
Figure 18B:
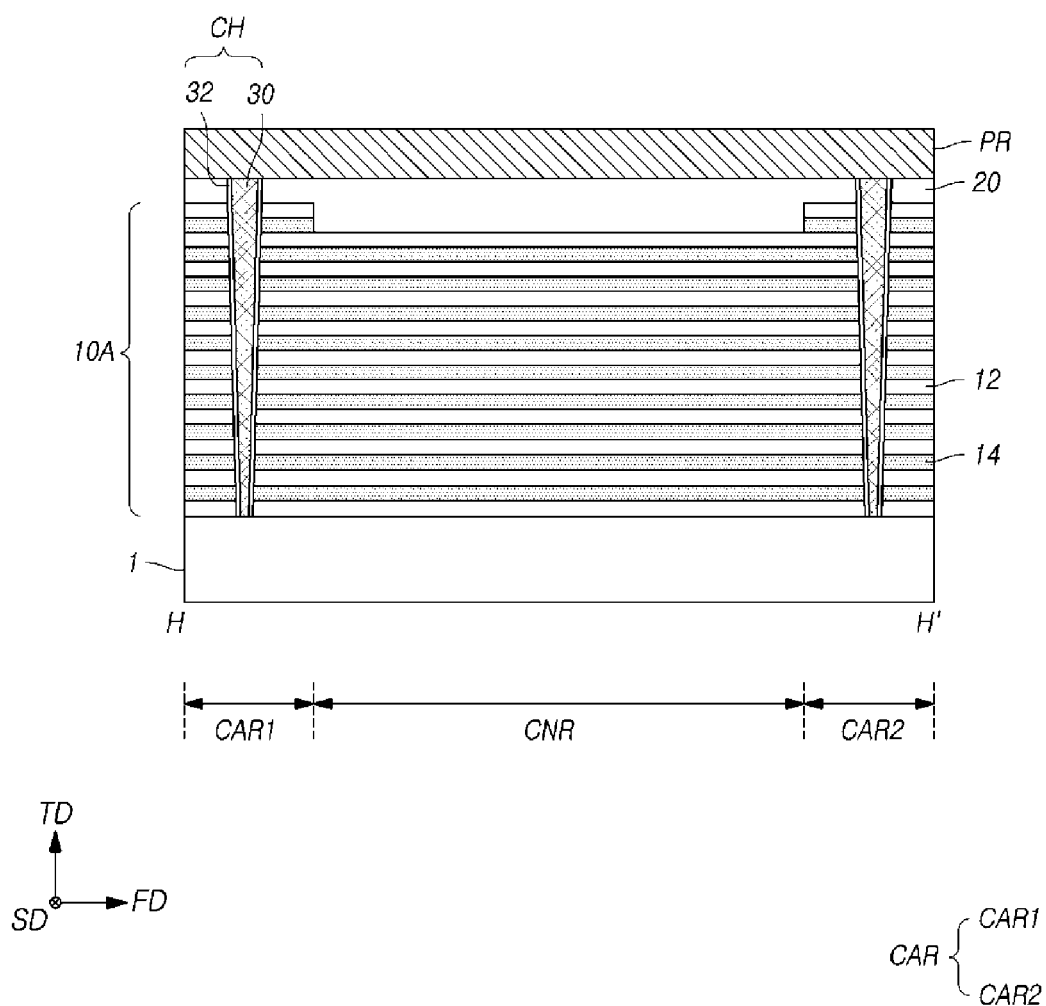

Referring to FIGS. 18A to 18C, a mask pattern PR having slit-like openings may be formed on the first interlayer dielectric layer 20 and the channel structures CH. The distance between the openings of the mask pattern PR in the cell area CAR may be a first distance D1. The distance between the openings of the mask pattern PR in the connection area CNR may be a second distance D2, and the second distance D2 may be larger than the first distance D1.

By etching the pre-stack 10A using the mask pattern PR as an etch mask, first slits S1 and second slits S2 may be formed.

The first slits S1 may divide the pre-stack 10A in units of memory block BLK. The second slits S2 may further divide the pre-stack 10A within a memory block BLK. The first slits S1 may be formed through connection area CNR and the cell area CAR, and the second slits S2 may be formed in only the cell area CAR. The distance between the slits S1 and S2 in the cell area CAR may be substantially the same as the first distance D1. The distance between the slits S1 in the connection area CNR may be substantially the same as the second distance D2. The mask pattern PR may be formed of a photoresist, and may be removed after the slits S1 and S2 are formed.

Figure 19B:
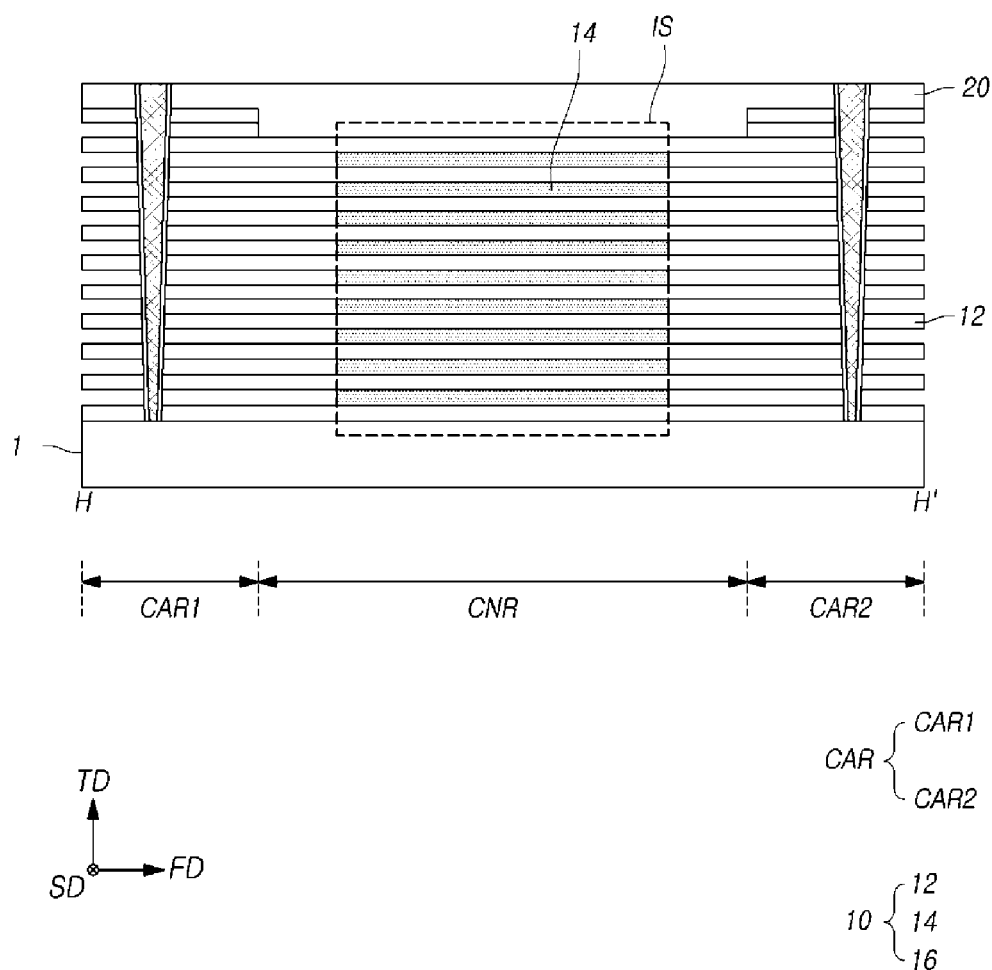
Figure 19C:
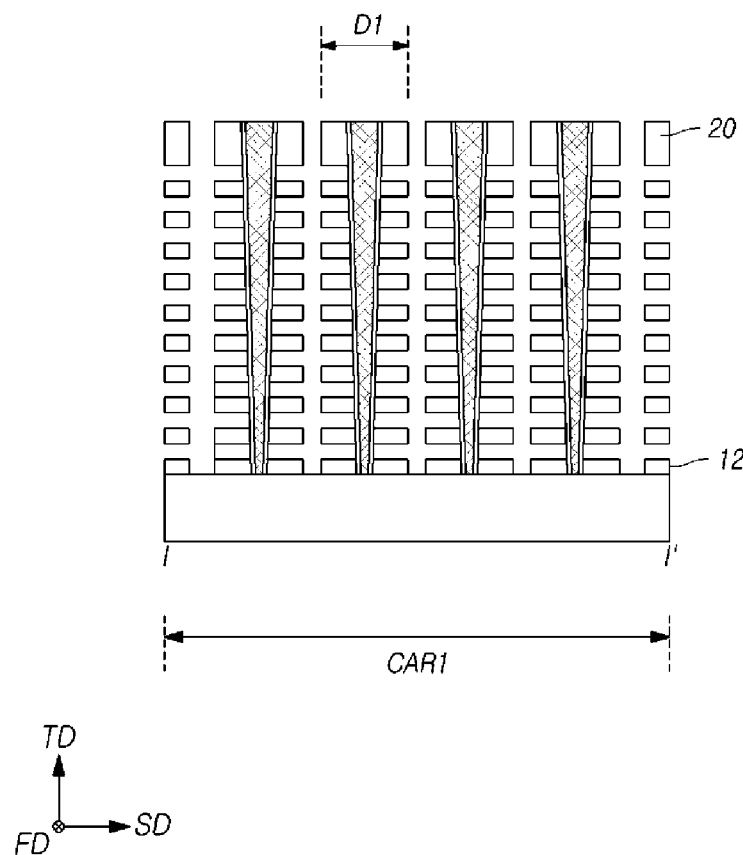

Referring to FIGS. 19A to 19C, a wet etching process for removing the second dielectric layers 14 of the cell area CAR may be performed. While the wet etching process is performed, an etching solution capable of removing the second dielectric layers 14 may be injected through the slits S1 and S2. Since the etching solution is injected through the slits S1 and S2, material from the second dielectric layers 14 adjacent to the slits S1 and S2 may be removed. Since the distance D2 between the slits S1 in the connection area CNR is larger than the distance D1 between the slits S1 and S2 in the cell area CAR, the second dielectric layers 14 of the cell area CAR may be removed and some material from the second dielectric layers 14 at the edges or boundaries of the connection area CNR, near the slits S1 and S2, may also be removed. Some material from the second dielectric layers 14 in the central part of the connection area CNR, however, may remain. The remaining second dielectric layers 14 may define the insulation region IS together with the overlying and underlying first dielectric layers 12.

Figure 20A:
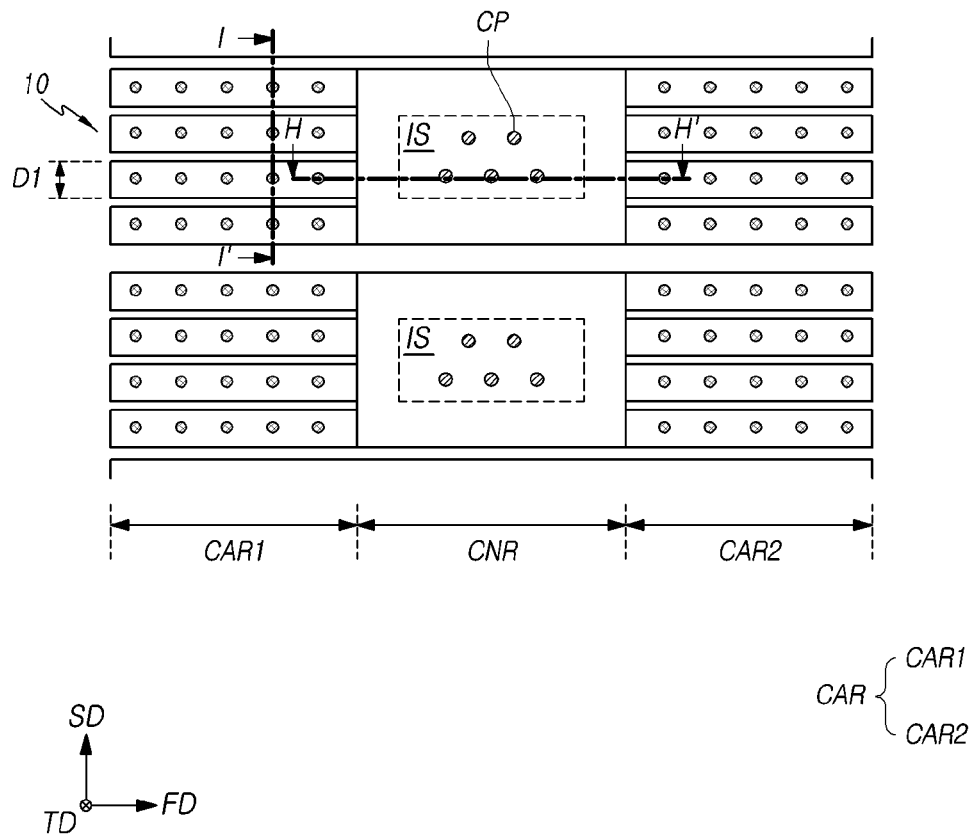
Figure 20C:
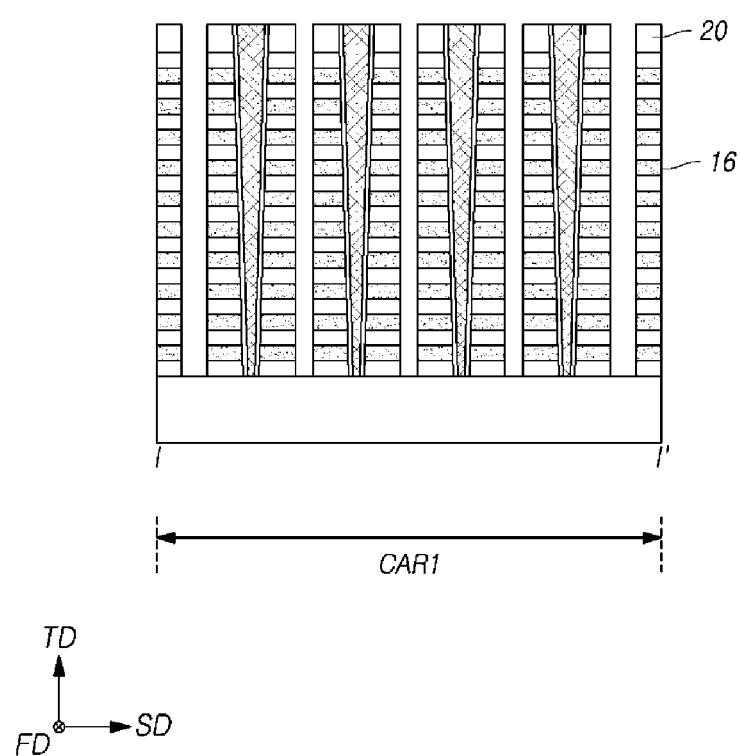

Referring to FIGS. 20A to 20C, by filling spaces from which the second dielectric layers 14 are removed with a conductive material, electrode layers 16 may be formed. For example, the conductive material used as the electrode layers 16 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Thus, the second dielectric layers 14 in the cell area CAR and in the periphery of the connection area CNR that have been selectively etched away may be replaced with the electrode layers 16.

Contact plugs CP, which vertically pass through or penetrate the first interlayer dielectric layer 20 and the first and second dielectric layers 12 and 14 of the insulation region IS, may be formed. The first and second dielectric layers 12 and 14 of the insulation region IS may provide spaces in which the contact plugs CP are disposed.

FIGS. 21A to 25B are examples of views to assist in the explanation of a method for manufacturing a semiconductor memory device in relation with the disclosure. In detail, FIGS. 21A to 25A represent top views to assist in the explanation of the method for manufacturing a semiconductor memory device in relation with the disclosure. FIGS. 21B to 25B are cross-sectional views taken along the lines J-J' of FIGS. 21A to 25A, respectively.

Figure 21B:
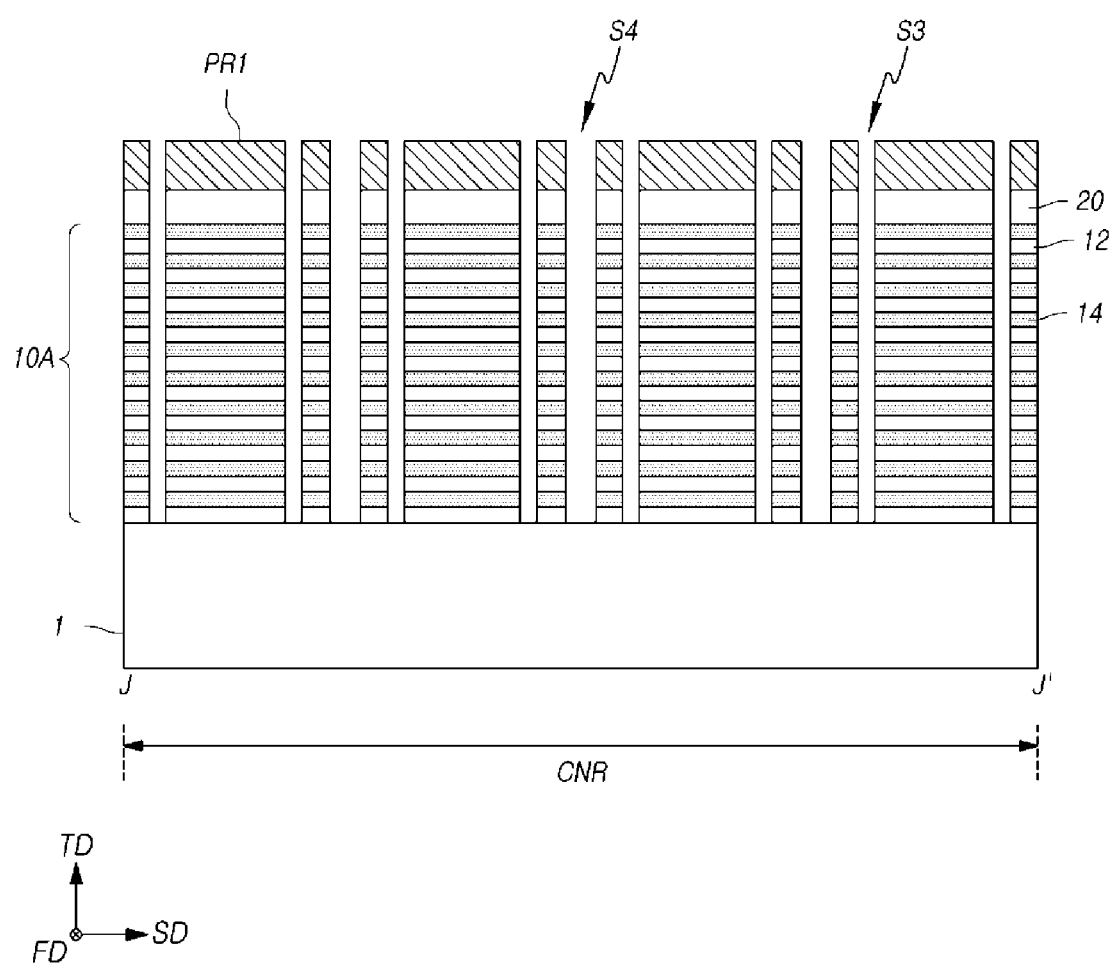

Referring to FIGS. 21A and 21B, first dielectric layers 12 and second dielectric layers 14 may be alternately stacked on or over a substrate 1, which is defined with or divided into a cell area CAR and a connection area CNR, and thereby, a pre-stack 10A may be formed. A first interlayer dielectric layer 20 which covers the pre-stack 10A may be formed on the substrate 1, and channel structures CH which pass through or penetrate the first interlayer dielectric layer 20 and the pre-stack 10A may be formed in the cell area CAR.

A first mask pattern PR1 may be formed on the first interlayer dielectric layer 20 and the channel structures CH, and, by etching the pre-stack 10A using the first mask pattern PR1 as an etch mask, third slits S3 and fourth slits S4 may be formed.

The third slits S3 may be disposed in the connection area CNR, and may have a closed loop shape when viewed in a top view. The fourth slits S4 may extend in the first direction FD in the cell area CAR and the connection area CNR, and may divide the pre-stack 10A and the channel structures CH into a plurality of parts. The distance between the slits S3 in the connection area CNR may be similar to or smaller than the distance between the slits S4 defined in the cell area CAR, i.e., d1 is greater than d21. The first mask pattern PR1 may be removed after the slits S3 and S4 are formed.

Figure 22A:
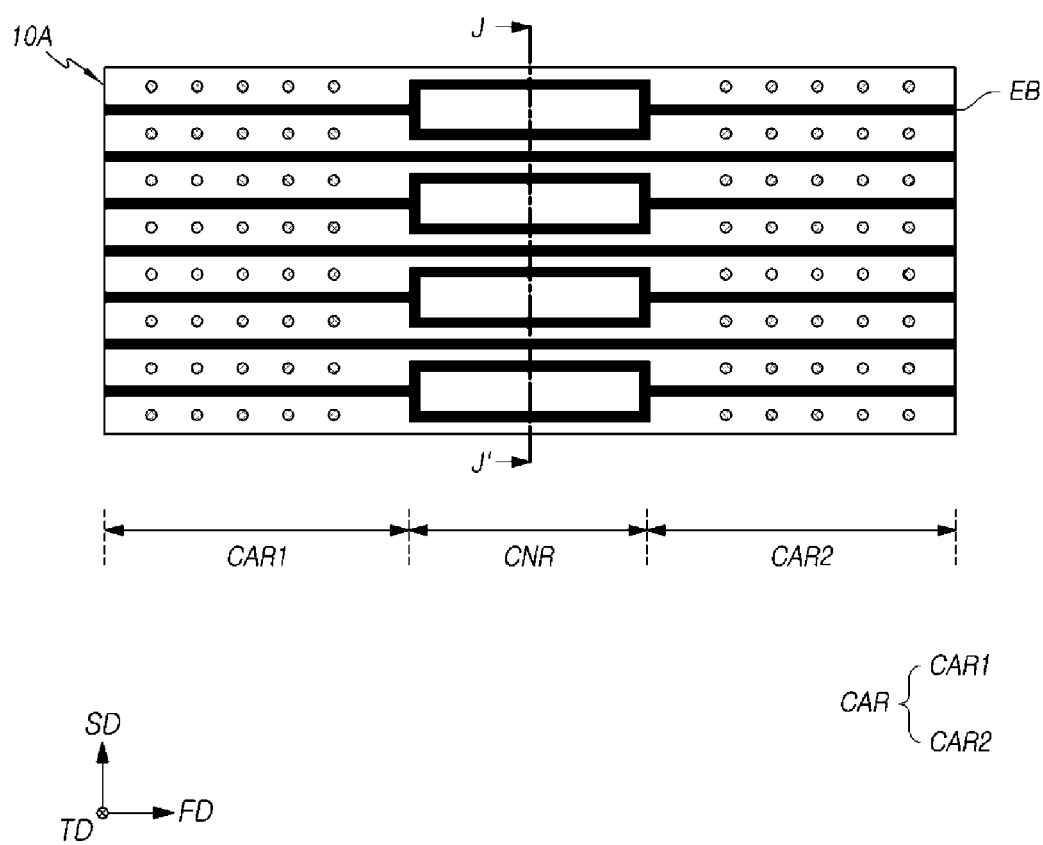
Figure 22B:
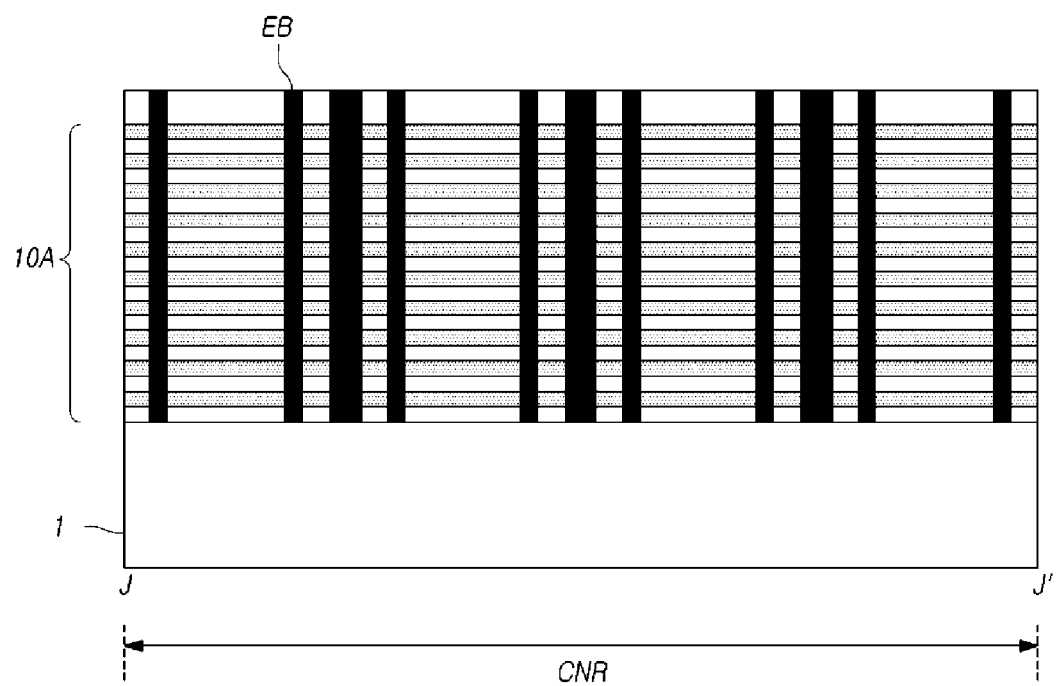

Referring to FIGS. 22A and 22B, an etch barrier EB, which fills the slits S3 and S4, may be formed. The etch barrier EB may be formed of a dielectric material having etch resistance to an etching solution for removing the second dielectric layers 14. For example, if the second dielectric layers 14 are formed of nitride, then the etch barrier EB may be formed of silicon oxide.

Figure 23B:
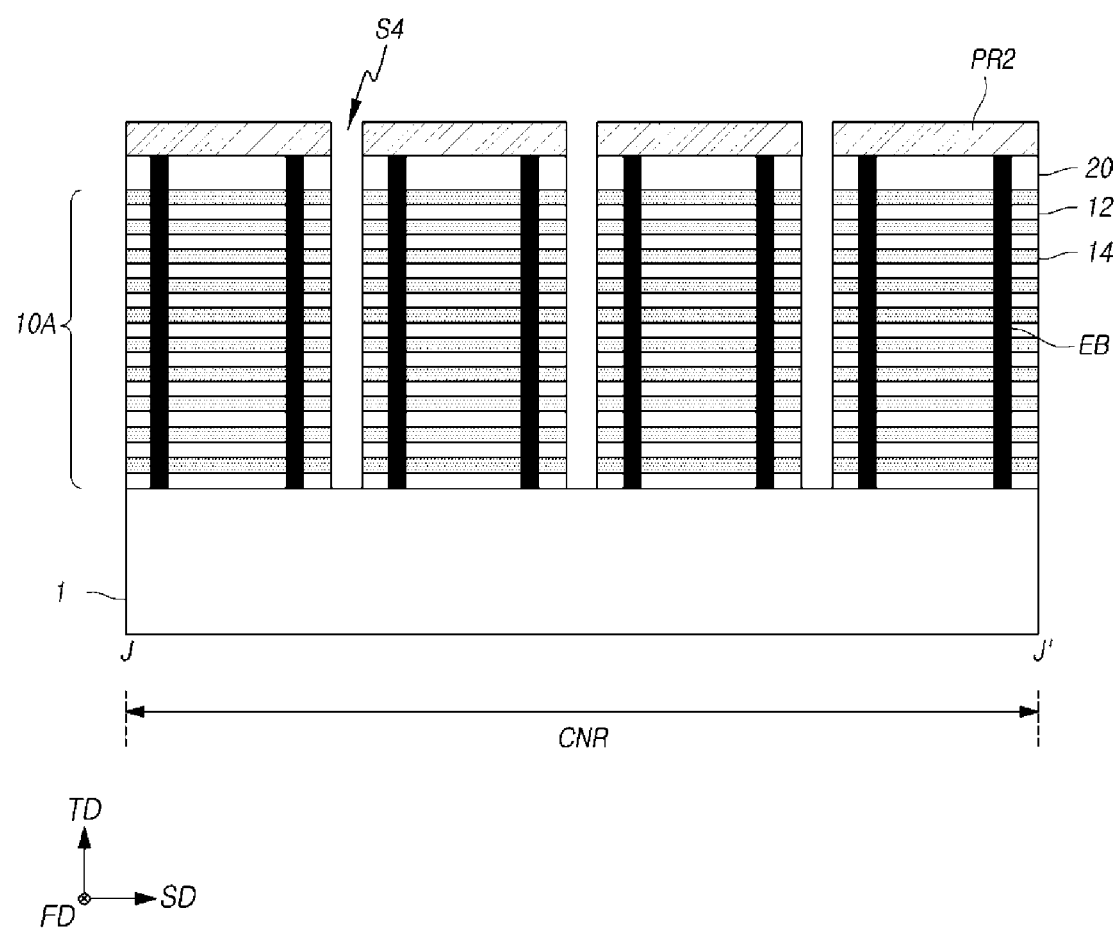

Referring to FIGS. 23A and 23B, a second mask pattern PR2, which covers the first interlayer dielectric layer 20 of the connection area CNR and the etch barrier EB filled in the third slits S3, and which exposes the cell area CAR and the etch barrier EB filled in the fourth slits S4 of the connection area CNR, may be formed.

The etch barrier EB may be removed by an etching process using the second mask pattern PR2 as an etch mask. Due to this fact, the etch barrier EB filled in the fourth slits S4 may be removed, and the etch barrier EB filled in the third slits S3 of the connection area CNR may remain. The second mask pattern PR2 may be removed after the etch barrier EB is removed from fourth slits S4.

Figure 24A:
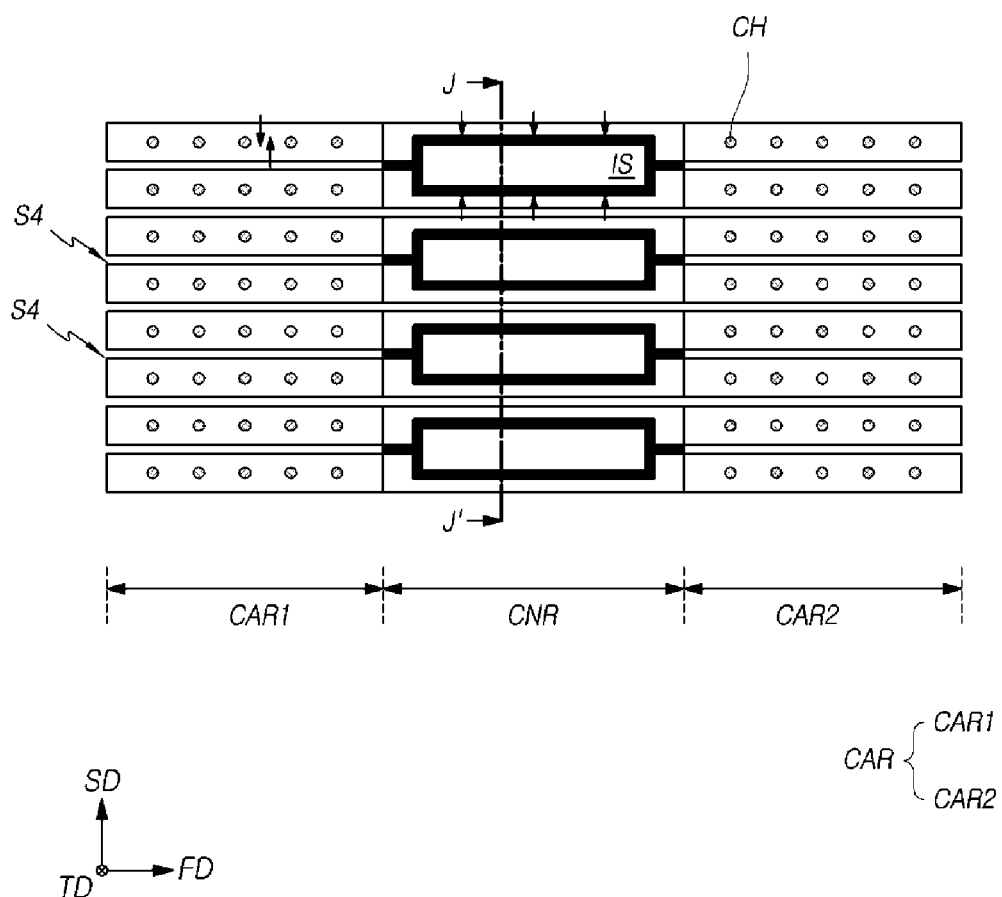

Referring to FIGS. 24A and 24B, a wet etching process for removing the second dielectric layers 14 may be performed. While the wet etching process is performed, an etching solution capable of removing the second dielectric layers 14 may be injected through the fourth slits S4.

Since the etch barrier EB is formed of a material which has etch resistance to the etching solution, the portions of second dielectric layers 14 which are surrounded by the etch barrier EB may remain without being removed. The remaining second dielectric layers 14 may define an insulation region IS together with the overlying and underlying first dielectric layers 12. The insulation region IS may be defined as an area which is surrounded by the etch barrier EB.

Figure 25B:
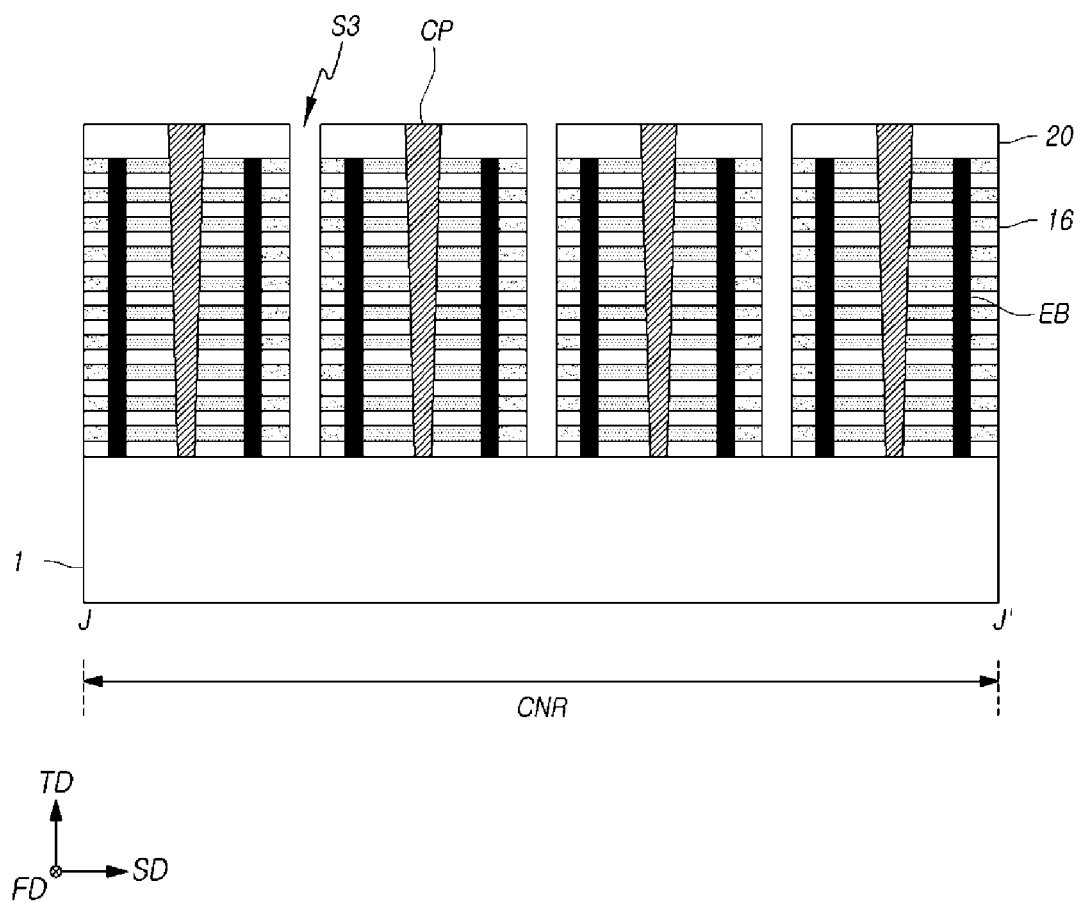

Referring to FIGS. 25A and 25B, electrode layers 16 may be formed by filling in spaces from which the second dielectric layers 14 are removed with a conductive material. Contact plugs CP which vertically pass through or penetrate the first and second dielectric layers 12 and 14 of the insulation region IS and the first interlayer dielectric layer 20 may be formed.

As described above with reference to FIGS. 21A to 25B, if an etch barrier EB is used to define the insulation region IS, then the above-described processes of forming a material used as the etch barrier EB, forming the second mask pattern PR2, of removing the etch barrier EB exposed by the second mask pattern PR2, of removing the second mask pattern PR2 remaining after the removal of the etch barrier EB, and so forth need to be performed.

As a result of market factors, buyers are highly sensitive to the price of semiconductor memory devices. Reducing the number of manufacturing steps in a manufacturing process is a very important factor in reducing a manufacturing time and manufacturing costs. Further, by simplifying the process through a reduction in the number of manufacturing steps, it is possible to reduce failures occurring during the manufacturing process.

According to the embodiments of the disclosure, by configuring the distance D2 between the slits S1 of the connection area CNR to be larger than the distance D1 between the slits S1 and S2 of the cell area CAR, the second dielectric layers 14 may be prevented, in the wet etching process for removing the second dielectric layers 14 of the cell area CAR, from being removed in the central part of the connection area CNR which is distant from the slits S1 and S2, and thereby, the insulation region IS for disposition of the contact plugs CP may be configured. That is to say, according to the embodiments of the disclosure, the insulation region IS may be configured even without forming an etch barrier. Therefore, manufacturing steps necessary for forming the etch barrier, for example, step of forming a material used as the etch barrier, step of forming a mask pattern which covers an area where contact plugs are to be disposed, step of removing the etch barrier exposed by the mask pattern and step of removing the mask pattern remaining after the removal of the etch barrier may be omitted. Accordingly, a manufacturing time and manufacturing costs may be reduced, and failures occurring during a manufacturing process may be reduced, thereby contributing to improvement in yield.

Figure 26:
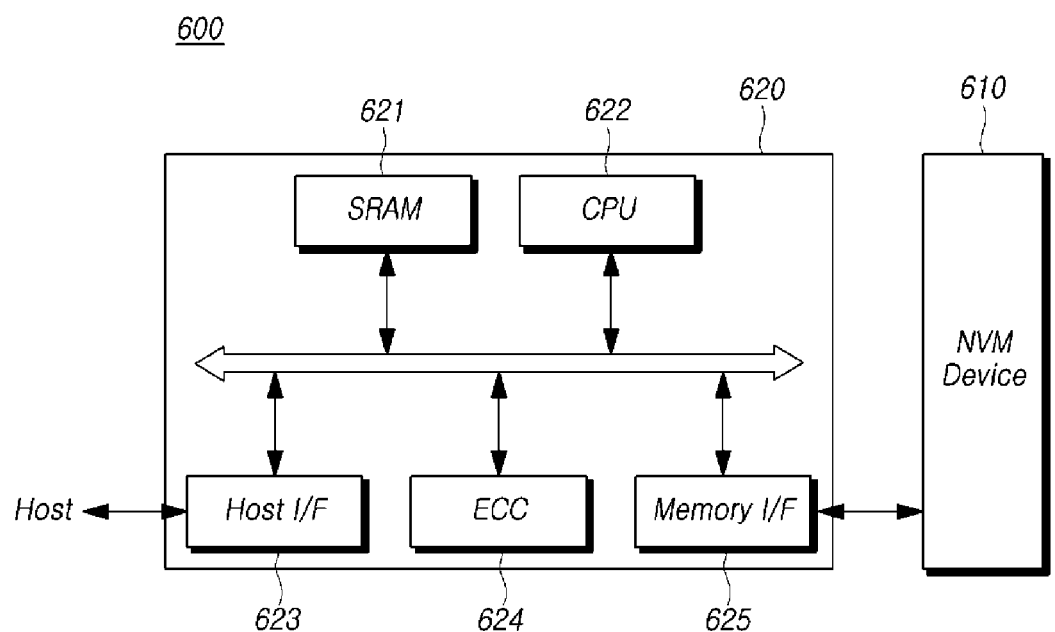
FIG. 26 is a diagram schematically illustrating a memory system including a semiconductor memory device in accordance with an embodiment of the disclosure.

FIG. 26 is a simplified block diagram schematically illustrating a memory system including a semiconductor memory device according to an embodiment of the present disclosure.

Referring to FIG. 26, the memory system 600 may include the nonvolatile memory device 610 and a memory controller 620.

The nonvolatile memory device 610 may be comprised of a nonvolatile memory device according to an embodiment of the disclosure as described above, and may be operated in the manner described above.

The memory controller 620 may control the nonvolatile memory device 610. For example, the combination of the nonvolatile memory device 610 and the memory controller 620, may be configured as a memory card or a solid state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the nonvolatile memory device 610.

The memory interface 625 may interface with the nonvolatile memory device 610. The CPU 622 may perform general control operations for data exchange of the memory controller 620.

Although not shown, it should become apparent to a person skilled in the art that the memory system 600 may further be provided with a ROM which stores code data for interfacing with the host. The nonvolatile memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 27:
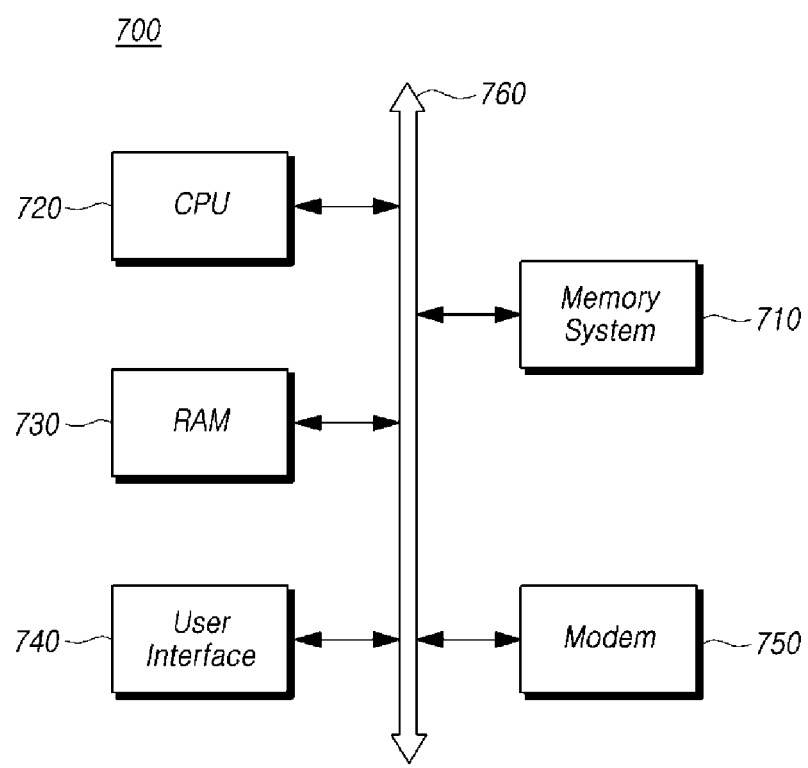
FIG. 27 is a block diagram schematically illustrating a representation of an example of a computing system including a semiconductor memory device in accordance with an embodiment of the disclosure.

FIG. 27 is a simplified block diagram schematically illustrating a computing system including a semiconductor memory device, according to an embodiment of the present disclosure.

Referring to FIG. 27, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

While various embodiments have been described above, it will be understood to those skilled in the art that the embodiments described are by way of example only. Accordingly, the semiconductor memory device described herein should not be limited based on the described embodiments.

What is claimed is:

1. A semiconductor memory device comprising:
   a stack with a cell area and a connection area disposed over a substrate;
   a plurality of channel structures passing through the stack in the cell area; and
   a plurality of slits,
   the stack comprising:
   a plurality of first dielectric layers;
   a plurality of electrode layers alternately stacked with the plurality of first dielectric layers in the cell area and in a periphery of the connection area; and
   a plurality of second dielectric layers alternately stacked with the plurality of first dielectric layers in a center of the connection area,
   wherein a distance between the slits in the connection area is greater than a distance between the slits in the cell area, and
   wherein, at an intersection of the periphery and the center of the connection area, one of the plurality of the electrode layers and one of the plurality of the second dielectric layers are in contact with each other.

2. The semiconductor memory device according to claim 1, further comprising:
   a plurality of contact plugs passing through the first and second dielectric layers in the center of the connection area.

3. The semiconductor memory device according to claim 1, further comprising:
   a plurality of bit lines disposed over the stack and connected to the plurality of channel structures through a plurality of bit line contacts,
   wherein the plurality of bit lines extends in a second direction and are spaced apart in a first direction intersecting with the second direction.

4. The semiconductor memory device according to claim 3,
   wherein the cell area comprises a first cell area and a second cell area spaced apart from each other in the first direction,
   wherein the connection area is disposed between the first cell area and the second cell area, and
   wherein the slits comprise:
   a plurality of first slits extending in the first direction in the first cell area and in the second cell area and in the connection area, and spaced apart in the second direction; and
   a plurality of second slits extending in the first direction in the first cell area and the second cell area,
   wherein at least one of the plurality of second slits is located between adjacent first slits in the first cell area and the second cell area.

5. The semiconductor memory device according to claim 4, wherein the first slits divide the stack and the channel structures into a unit of a memory block.

6. The semiconductor memory device according to claim 4, wherein the second slits divide the stack and the channel structures into a unit smaller than a memory block in the first and second cell areas.

7. The semiconductor memory device according to claim 1,
   wherein the electrode layers comprise a plurality of drain select lines, a plurality of source select lines, and a plurality of word lines which are disposed between the drain select lines and the source select lines, and
   wherein at least one of the drain select lines is cut from the connection area.

8. The semiconductor memory device according to claim 7, wherein the stack has a step structure with a plurality of pad areas of the drain select lines at ends of the first and second cell areas which are adjacent to the connection area.

9. The semiconductor memory device according to claim 7, wherein the stack has a step structure with a plurality of pad areas of the drain select lines at ends of the connection area adjacent to the first and second cell areas.

10. The semiconductor memory device according to claim 3,
    wherein the cell area comprises a first cell area and a second cell area spaced apart from each other in the second direction,
    wherein the connection area is disposed between the first cell area and the second cell area, and
    wherein the slits extend in the first direction and are spaced apart in the second direction.

11. The semiconductor memory device according to claim 3, further comprising:
    a slimming area adjacent to the connection area in the second direction,
    wherein the cell area is adjacent to the connection area in the first direction and adjacent to the slimming area in the first direction,
    wherein the electrode layers extend in different lengths from the cell area to the slimming area in the first direction, and
    wherein each of the electrode layers has an exposed pad area which is staggered with another electrode layer positioned thereon.

12. The semiconductor memory device according to claim 11, wherein a distance between the slits in the slimming area is smaller than a distance between the slits in the connection area.

13. A semiconductor memory device comprising:
    a memory structure disposed over a first substrate; and
    a logic structure disposed over a second substrate,
    the memory structure comprising:
    a stack with a cell area and a connection area disposed over the first substrate;
    a plurality of channel structures passing through the stack in the cell area; and
    a plurality of slits,
    the stack comprising:
    a plurality of first dielectric layers;
    a plurality of electrode layers alternately stacked with the plurality of first dielectric layers in the cell area and in a periphery of the connection area; and
    a plurality of second dielectric layers alternately stacked with the plurality of first dielectric layers in a center of the connection area, wherein a distance between the slits in the connection area is greater than a distance between the slits in the cell area, and wherein, at an intersection of the periphery and the center of the connection area, one of the plurality of the electrode layers and one of the plurality of the second dielectric layers are in contact with each other.

14. The semiconductor memory device according to claim 13, wherein the first substrate is disposed over the logic structure, and wherein the semiconductor memory device further comprises a plurality of contact plugs passing through the stack and the first substrate in the center of the connection area, and connected to the logic structure.

15. The semiconductor memory device according to claim 14, wherein the logic structure comprises:

a logic circuit disposed over the second substrate;

a plurality of interlayer dielectric layers covering the logic circuit; and a plurality of wiring lines disposed over the interlayer dielectric layers, wherein each of the plurality of contact plugs is connected to any one of the wiring lines.

16. The semiconductor memory device according to claim 13, wherein the memory structure comprises a plurality of first pads which are disposed over the stack, wherein the logic structure comprises a logic circuit which is disposed over the second substrate and a plurality of second pads which are disposed over the logic circuit and are connected to the logic circuit, and wherein the first pads and the second pads are bonded with each other.

17. The semiconductor memory device according to claim 16, further comprising:

a plurality of contact plugs are connected to the first pads and pass through the stack and the first substrate in the center of the connection area; and a plurality of third pads disposed under the first substrate, and connected to the contact plugs.

* * * * *